(12) United States Patent
Sashida

(10) Patent No.: US 6,673,672 B2
(45) Date of Patent: Jan. 6, 2004

(54) SEMICONDUCTOR DEVICE AND METHOD OF MANUFACTURING THE SAME

(75) Inventor: Naoya Sashida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/315,929

(22) Filed: Dec. 11, 2002

(65) Prior Publication Data

US 2003/0178663 A1 Sep. 25, 2003

(30) Foreign Application Priority Data

Mar. 19, 2002 (JP) ........................................ 2002-076178

(51) Int. Cl.[7] .......................................... H01L 21/8242
(52) U.S. Cl. ...................................... 438/253; 438/396
(58) Field of Search .......................... 257/296, 303, 257/304, 306, 310; 438/3, 239, 253, 254, 255, 396, 397, 240

(56) References Cited

U.S. PATENT DOCUMENTS 6,171,970 B1 * 1/2001 Xing et al. .................. 438/706
6,570,203 B2 * 5/2003 Hikosaka et al. ............ 257/295
2002/0006674 A1  1/2002 Ma et al. ........................ 438/3

FOREIGN PATENT DOCUMENTS

JP        2001-210798          8/2001

* cited by examiner

*Primary Examiner*—Long Pham
*Assistant Examiner*—Hoai Pham
(74) *Attorney, Agent, or Firm*—Armstrong, Westerman & Hattori, LLP.

(57) ABSTRACT

There is provided a semiconductor device manufacturing method which comprises the steps of forming a first insulating film over a silicon substrate (semiconductor substrate), forming a lower electrode, a dielectric film, and an upper electrode of a capacitor on the first insulating film, forming a first capacitor protection insulating film for covering at least the dielectric film and the upper electrode, forming a second capacitor protection insulating film, which covers the first capacitor protection insulating film, by a chemical vapor deposition method in a state that a bias voltage is not applied to the silicon substrate, and forming a second insulating film on the second capacitor protection insulating film by the chemical vapor deposition method in a state that the bias voltage is applied to the silicon substrate.

14 Claims, 32 Drawing Sheets

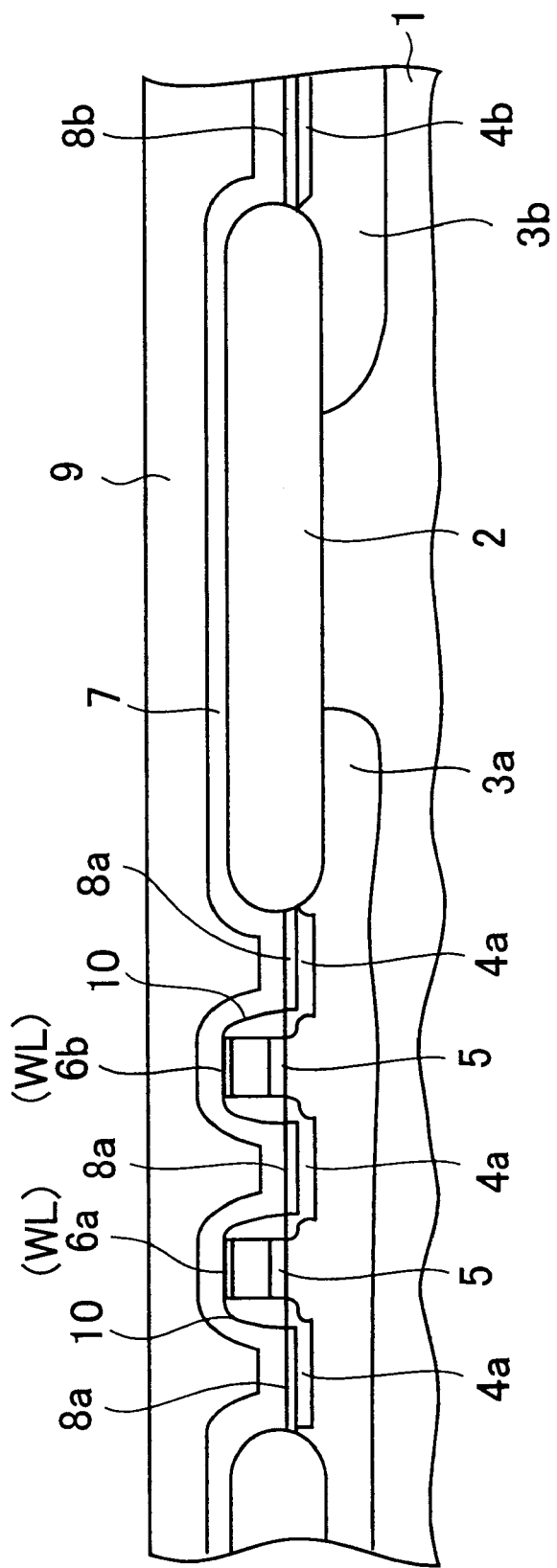

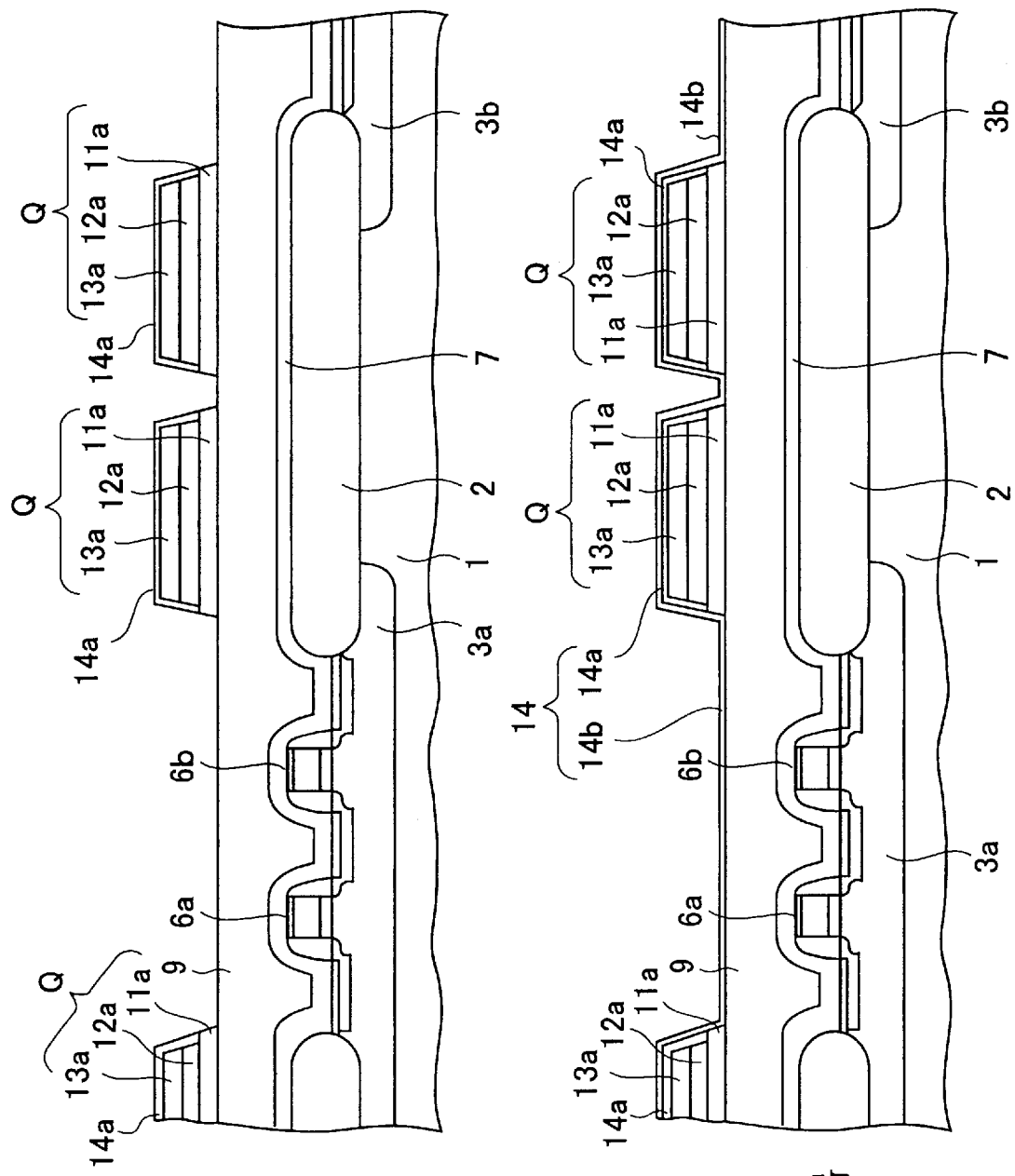

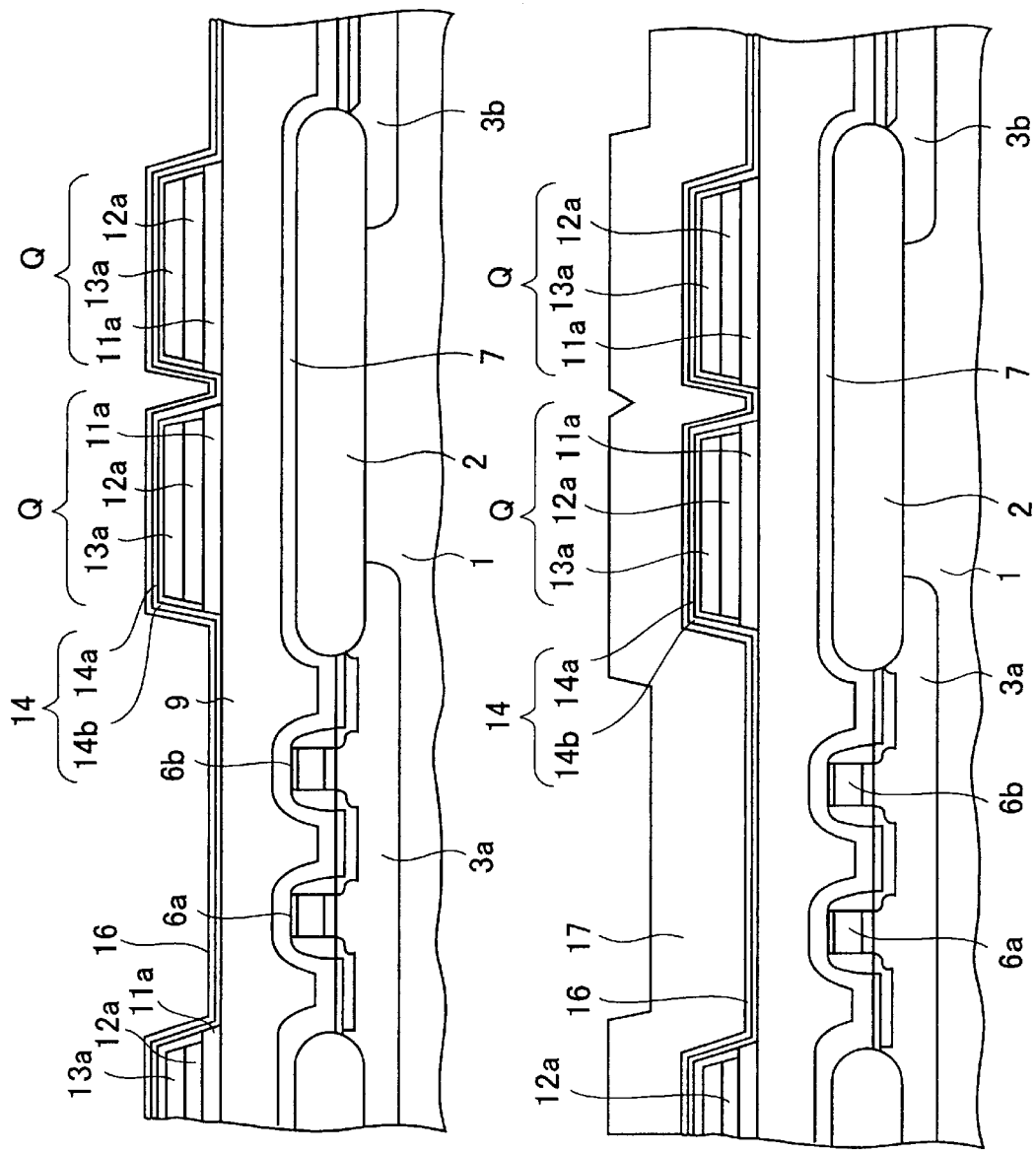

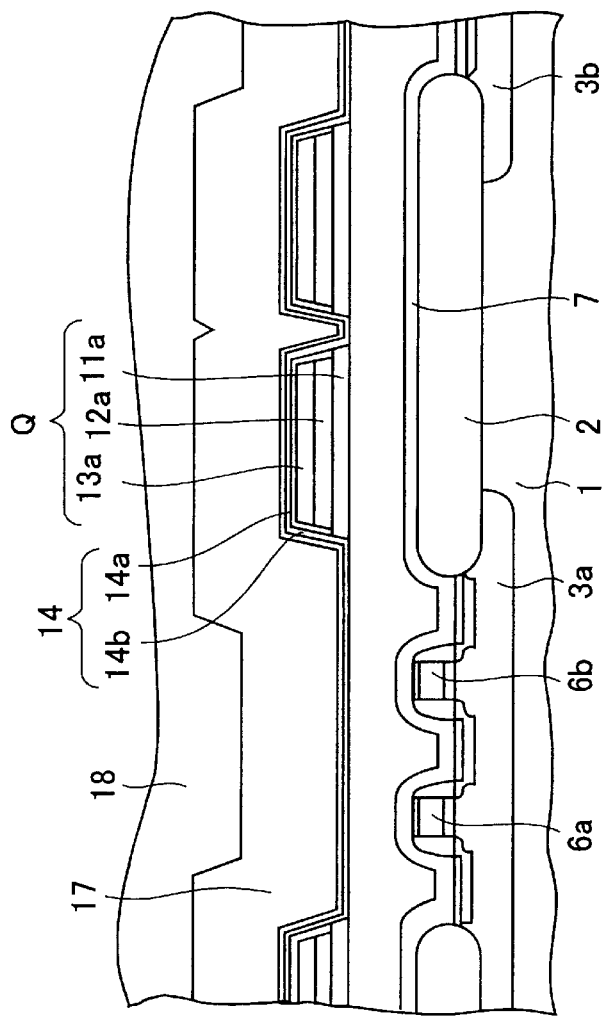
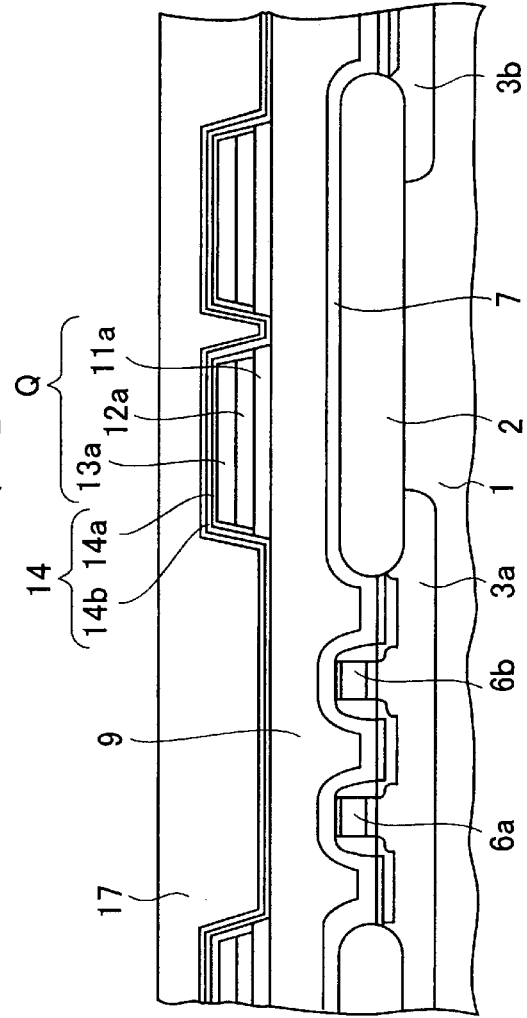
FIG. 1J
FIG. 1K

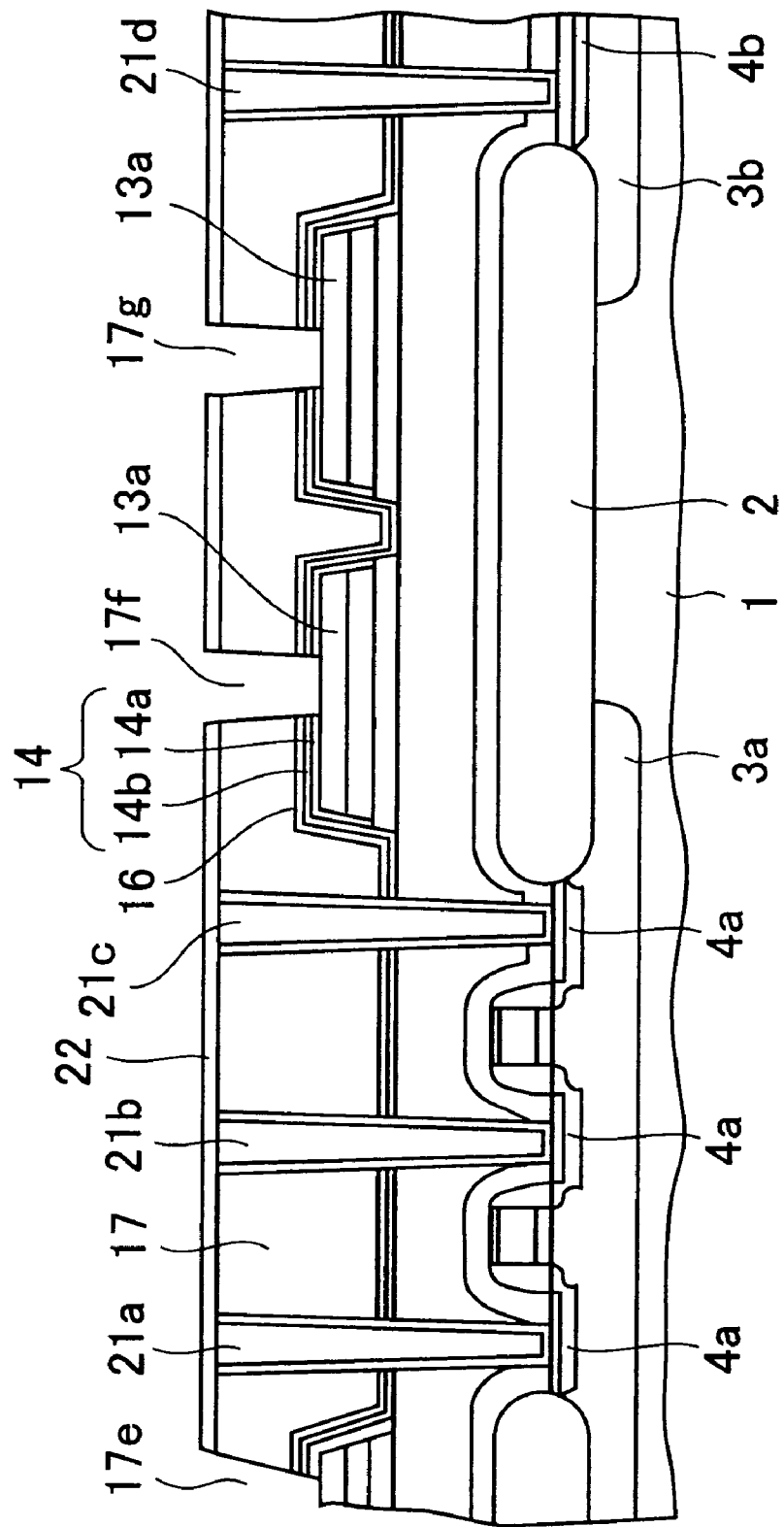

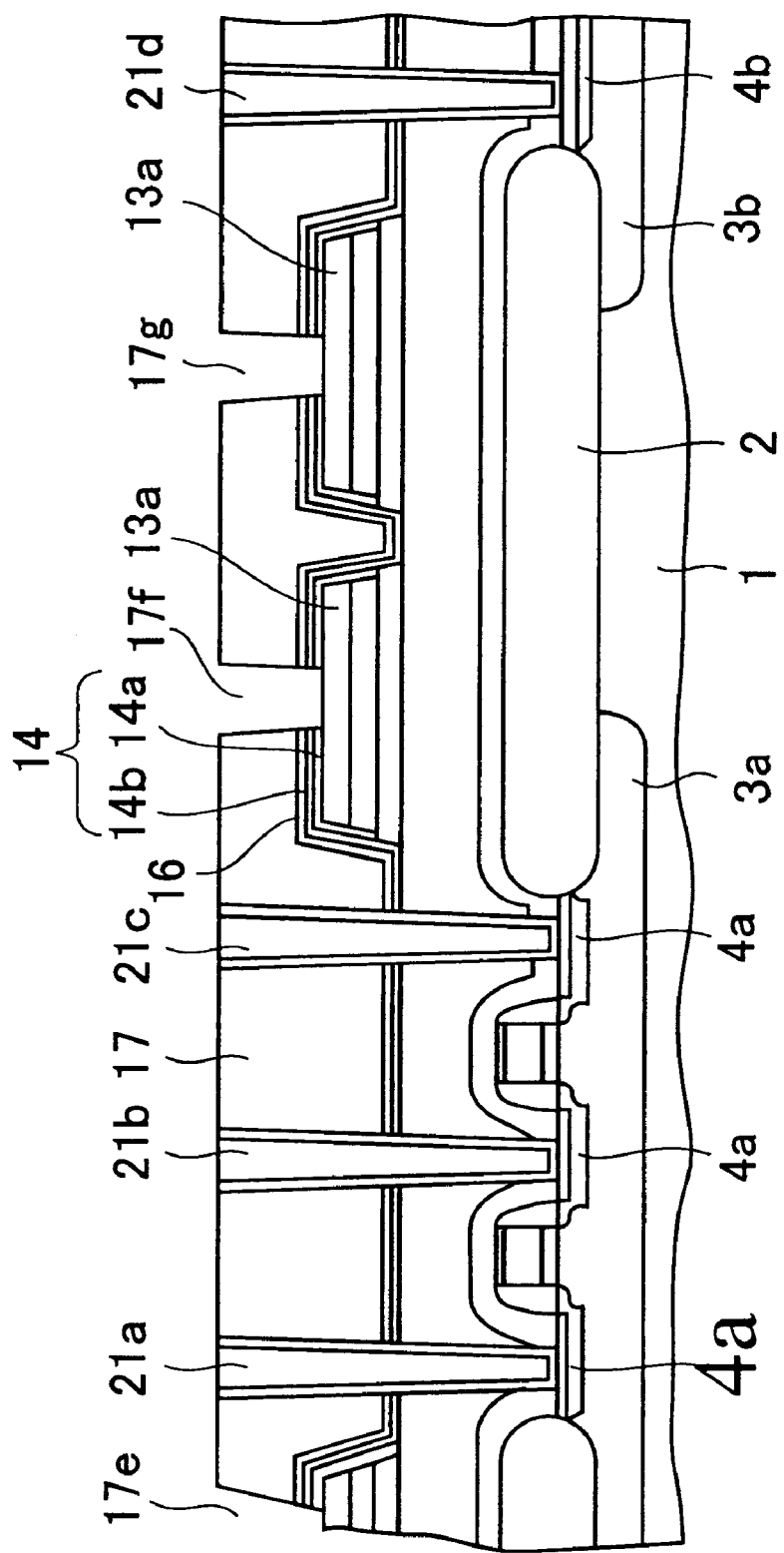

When A < (B/2)

When A ≧ (B/2)

cavity

SEMICONDUCTOR DEVICE AND METHOD OF MANUFACTURING THE SAME

CROSS-REFERENCE TO RELATED APPLICATIONS

This application is based upon and claims priority of Japanese Patent Application No. 2002-76178, filed in Mar. 19, 2002, the contents being incorporated herein by reference.

BACKGROUND OF THE INVENTION

1. Field of the Invention

The present invention relates to a semiconductor device and a method of manufacturing the same and, more particularly, to a semiconductor device having a nonvolatile memory (FeRAM: Ferroelectric Random Access Memory) in which ferroelectric material is employed as the dielectric film of the capacitor and a method of manufacturing the same.

2. Description of the Prior Art

In the FeRAM, the cell area will be more reduced in response to the demand for the higher integration in the future. If the cell area is reduced in such a way, the interval between neighboring capacitors is also shortened and the wiring interval is also narrowed accordingly. It is general that the spaces between the capacitors and the spaces between the wirings are buried with the insulating film. In this case, if the higher integration makes progress as above, the insulating film having the good filling property not to form the cavity (also called as the blowhole or the void) between the capacitors must be employed as such insulating film.

As the insulating film having the good filling property, the film that is formed by the high density plasma CVD (HDPCVD) method is known in the prior art.

The insulating film that is formed by the HDPCVD method can be shown in FIG. 1 of Patent Application Publication (KOKAI) 2001-210798, for example. In this Publication, it is disclosed in the paragraph number 0042 that the HDP oxide can be used as the insulating film 134 for covering the capacitor in FIG. 1.

Similarly, in Patent Application Publication (KOKAI) 2001-230382, it is disclosed in the paragraph number 0084 that the HDP oxide can be used as the insulating film 408 for covering the capacitor in FIG. 4a.

Meanwhile, $SiH_4$ is used in general as the film forming gas in the HDPCVD method. This $SiH_4$ is decomposed during the film formation to generate the hydrogen. Thus, there is given the chance that the ferroelectric film of the capacitor is exposed to the hydrogen.

However, if the ferroelectric film is exposed to the reducing material such as the hydrogen or the like, the deterioration of the ferroelectric characteristic is brought about. Therefore, any measure for preventing such deterioration is needed.

In the usual plasma CVD method that is not the HDPCVD method, as the method of isolating the ferroelectric film from the hydrogen, the structure for covering the capacitor with the insulating film made of the metal oxide, e.g., the alumina ($Al_2O_3$) film, is known. Such structure is disclosed in Patent Application Hei 11-215600, Patent Application Publication (KOKAI) 2001-44375, Patent Application Publication (KOKAI) Hei 6-29098, and Japanese Patent No. 3056973.

However, it is made apparent by the inventors of the present invention that, in the HDPCVD method, this alumina film is not enough to block the hydrogen and thus the deterioration of the ferroelectric film is caused by the hydrogen.

SUMMARY OF THE INVENTION

It is an object of the present invention to provide a semiconductor device capable of preventing deterioration of a ferroelectric film in a capacitor when an insulating film for covering the capacitor is formed, and a method of manufacturing the same.

The above problems can be solved by providing a semiconductor device manufacturing method which comprises the steps of forming a first insulating film over a semiconductor substrate; forming a first conductive film, a ferroelectric film, and a second conductive film sequentially on the first insulating film; forming an upper electrode of a capacitor by patterning the second conductive film; forming a dielectric film of the capacitor by patterning the ferroelectric film; forming a lower electrode of the capacitor by patterning the first conductive film; forming a first capacitor protection insulating film covering the dielectric film and the upper electrode; forming a second capacitor protection insulating film, which covers the first capacitor protection insulating film, by a chemical vapor deposition method in a state that a bias voltage is not applied to the semiconductor substrate; and forming a second insulating film on the second capacitor protection insulating film by the chemical vapor deposition method in a state that the bias voltage is applied to the semiconductor substrate.

Next, advantages of the present invention will be explained hereunder.

According to the present invention, the first capacitor protection insulating film for covering the capacitor dielectric film and the upper electrode is formed. Then, the second capacitor protection insulating film is formed on the first capacitor protection insulating film in the state that the bias voltage is not applied to the semiconductor substrate, and then the second insulating film is formed in the state that the bias voltage is applied.

Because the second insulating film is formed in the state that the bias voltage is applied, the electric field is concentrated onto the shoulder portion of the capacitor, for example, and then the sputter ions are pulled into the shoulder portion by this electric field. Accordingly, the deposition and the sputter of the film are executed simultaneously at the shoulder portion, so that it can be prevented that the film is formed thick on the shoulder portion. As a result, the film thickness on the side surfaces of the capacitor can be made even, and thus the second insulating film having the good filling property can be formed between the capacitors of high aspect ratio. Since the filling property is good, the cavity is not formed in the second insulating film between the capacitors even when the interval between the capacitors is narrowed with the progress of the higher integration.

In addition, even when the second insulating film is formed in the state that the bias voltage is applied, the collision energy of the sputter ions and other ions is absorbed by the second capacitor protection insulating film to decrease its moving speed. As a result, the ions can be blocked by the underlying first capacitor protection insulating film, and thus the capacitor dielectric film can be prevented from being deteriorated by the ions.

Further, the second capacitor protection insulating film is formed in the state that the bias voltage is not applied to the semiconductor substrate. Therefore, the capacitor dielectric film can be prevented from being deteriorated in the film formation.

Similarly, when the first capacitor protection insulating film is formed in the state that the bias voltage is not applied to the semiconductor substrate, the deterioration of the capacitor dielectric film in the film formation can be prevented.

Also, since the second capacitor protection insulating film is formed by the chemical vapor deposition method using the reaction gas containing TEOS, the coverage of the second capacitor protection insulating film can be improved, and thus the collision ions can be absorbed at the upper portion and the side portions of the capacitor uniformly. Further, since hydrogen, which is reducing substance, is hard to generate from TEOS in contrast to $SiH_4$, there is no chance that the capacitor is deteriorated by the hydrogen.

In this case, when the second insulating film is formed by the chemical vapor deposition method using the reaction gas containing any one of $SiH_4$, $Si_2H_6$, $Si_3H_8$, and $SiCl_4$, an amount of carbon contained in the second capacitor protection insulating film becomes larger than an amount of carbon contained in the second insulating film.

Further, it is preferable that the above first capacitor protection insulating film be formed to have a double-layered structure consisting of the lower protection insulating film, which covers the dielectric film and the upper electrode of the capacitor, and the upper protection insulating film, which is formed on the lower protection insulating film and the first insulating film. According to this, since the capacitor and the first insulating film are covered continuously with the upper protection insulating film, it is possible to prevent the entering of the reducing substance such as the hydrogen, or the like into the capacitor dielectric film via the first insulating film.

Besides, where the capacitor is formed in plural, if the total film thickness of the first capacitor protection insulating film and the second capacitor protection insulating film is set smaller than half of the minimum interval among a plurality of upper electrodes, the spaces between the capacitors can be filled desirably, with the second insulating film between the capacitors free from cavity.

Moreover, it is preferable that the film thickness of the second insulating film be set thicker than the total film thickness of the capacitor upper electrode, the capacitor dielectric film, and the capacitor lower electrode but thinner than the film thickness that is obtained by adding 1 $\mu$m to the total film thickness. According to this, while suppressing maximally the deterioration of the capacitor dielectric film due to ions that are generated in the film formation of the second insulating film, the spaces between the capacitors can be filled with the second insulating film.

Also, where the surface of the second insulating film is planarized by the polishing, the third insulating film is formed on the second insulating film before the polishing, and then the second and third insulating films are polished together. Therefore, the film thickness to be polished can be increased and also the distribution of the film thickness after the polishing can be set uniformly.

DESCRIPTION OF THE PREFERRED EMBODIMENTS

Next, embodiments of the present invention will be explained in detail with reference to the accompanying drawings hereinafter.

First Embodiment

Figure 1B:
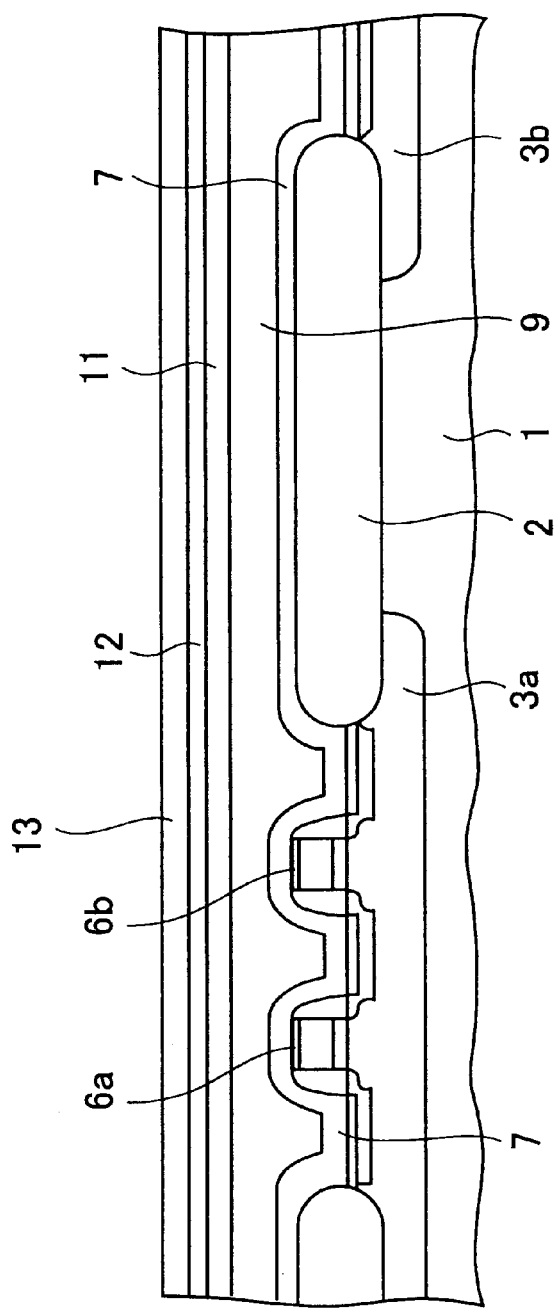
FIGS. 1A to 1R are sectional views showing steps of manufacturing an FeRAM as a semiconductor device according to a first embodiment of the present invention.
Figure 1C:
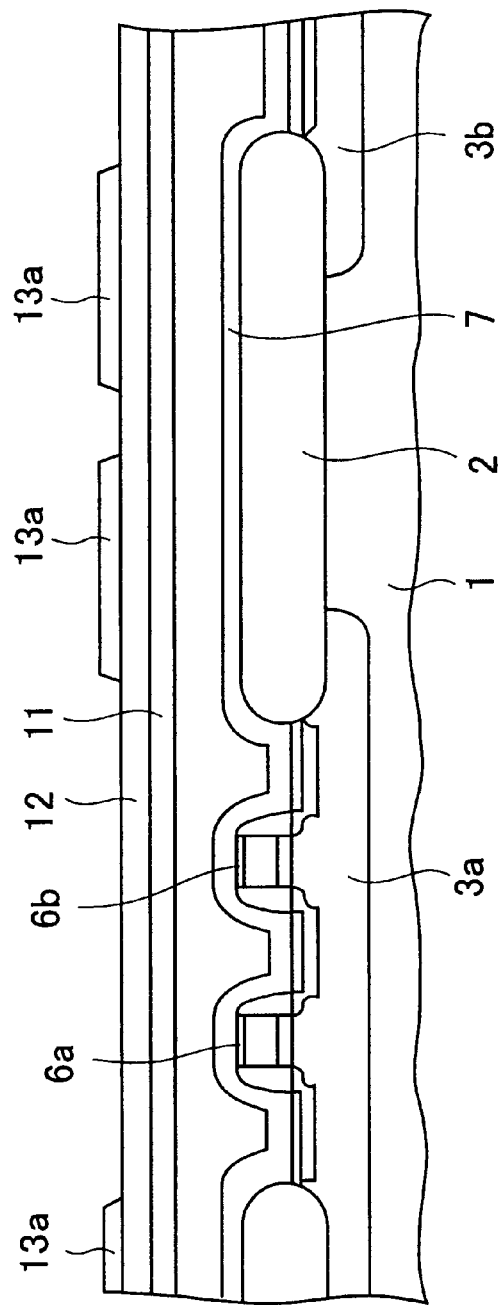
Figure 1D:
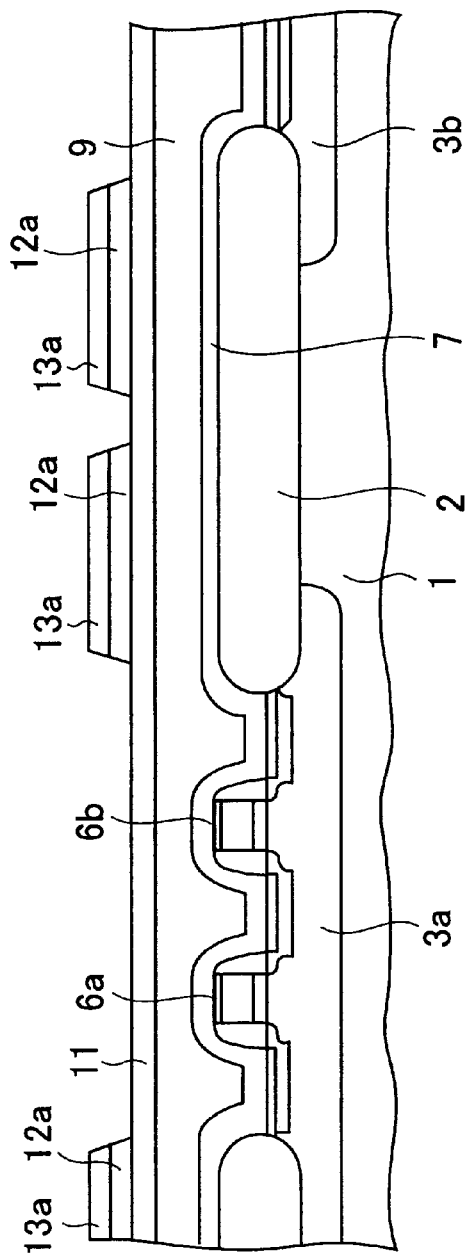
Figure 1E:
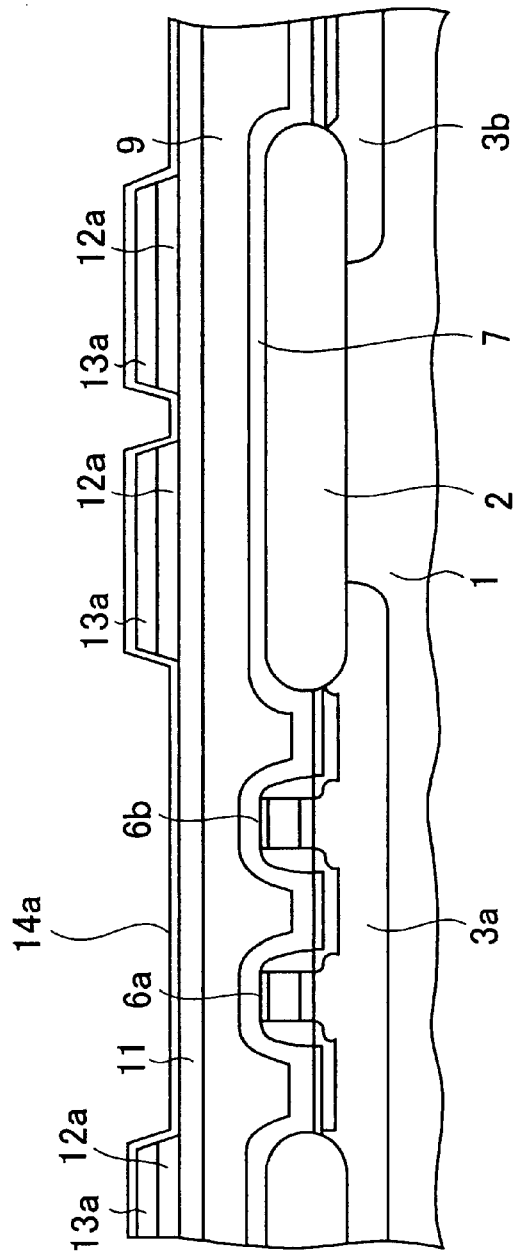
Figure 1L:
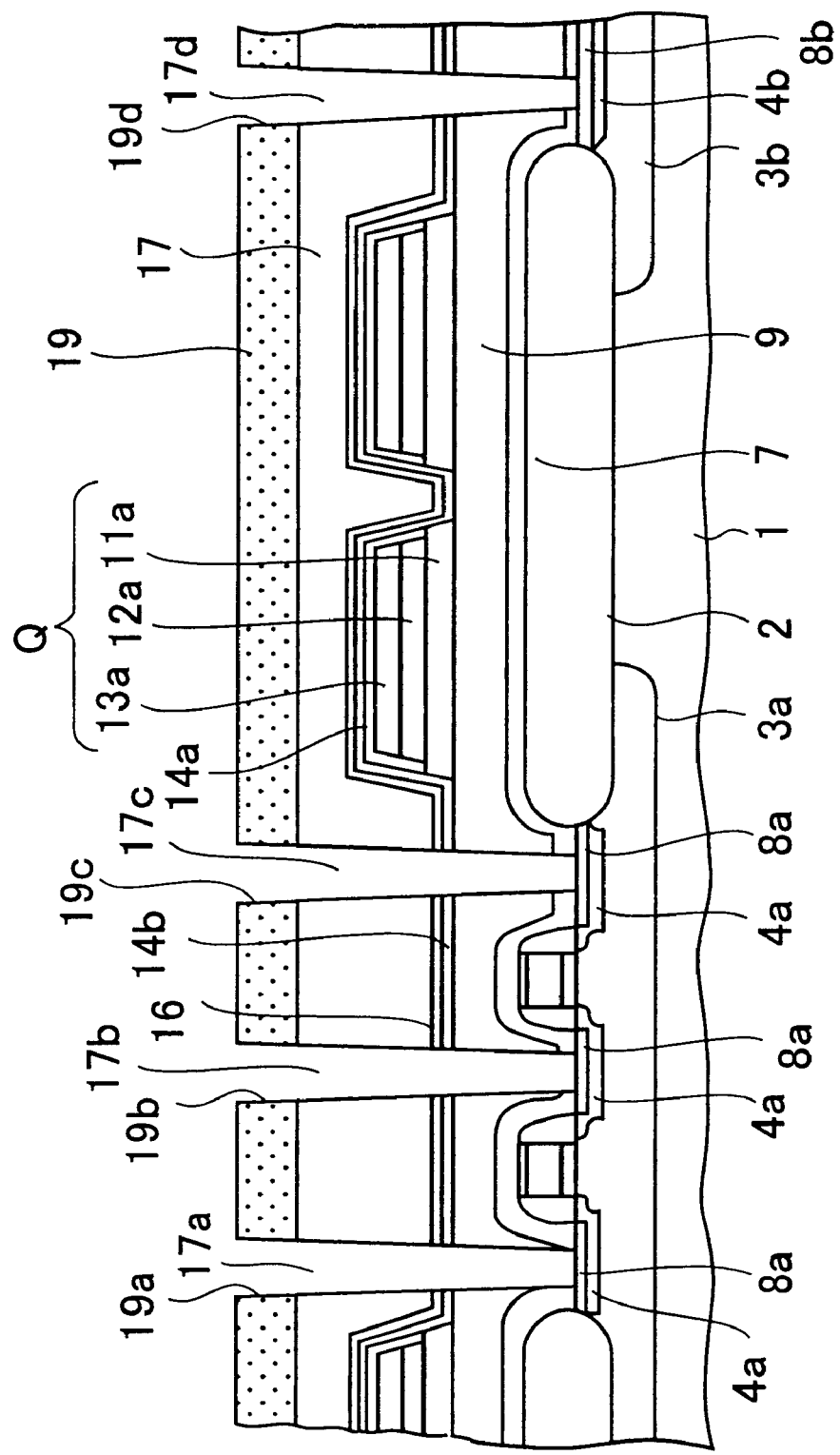
Figure 1M:
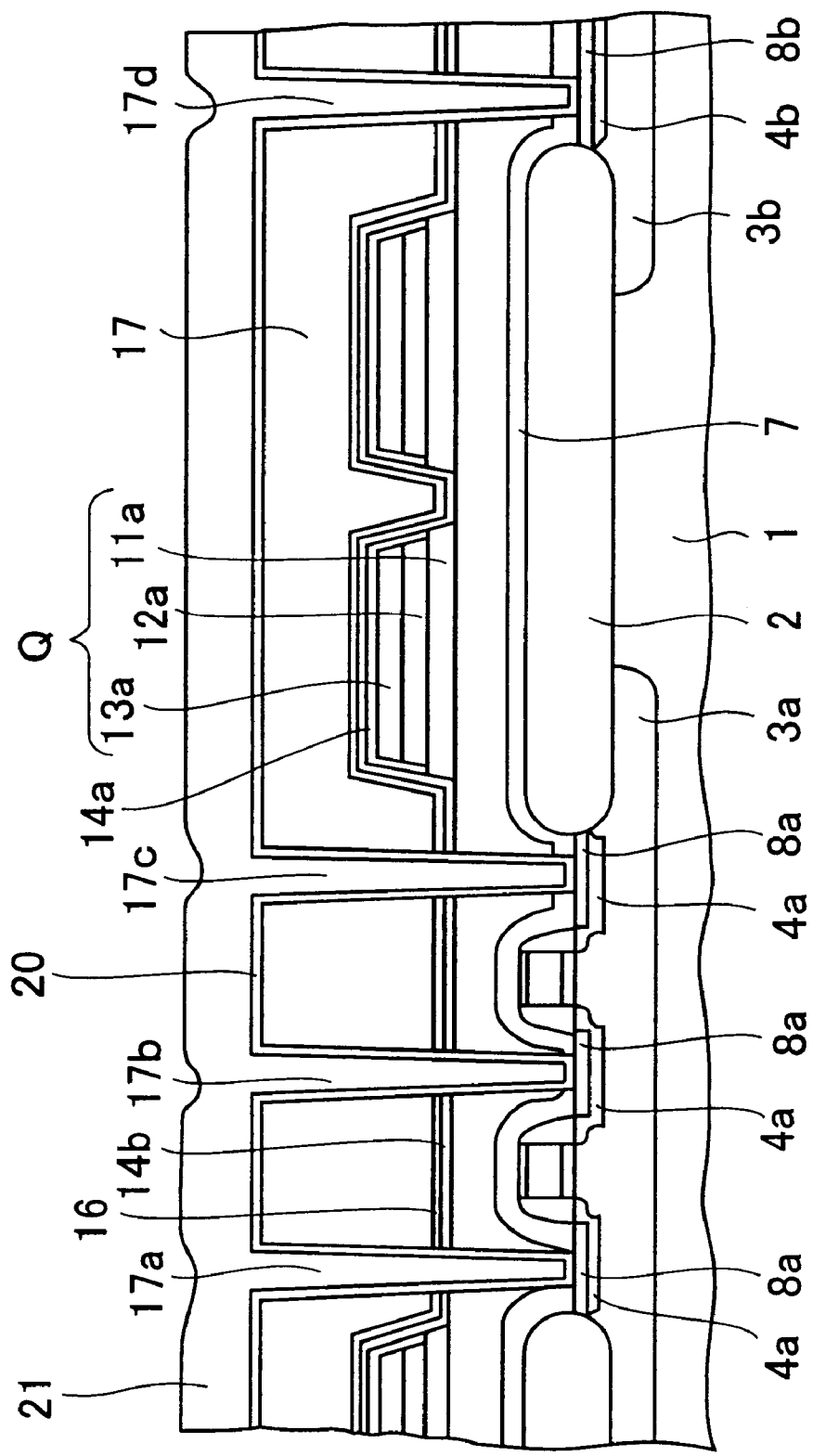
Figure 1N:
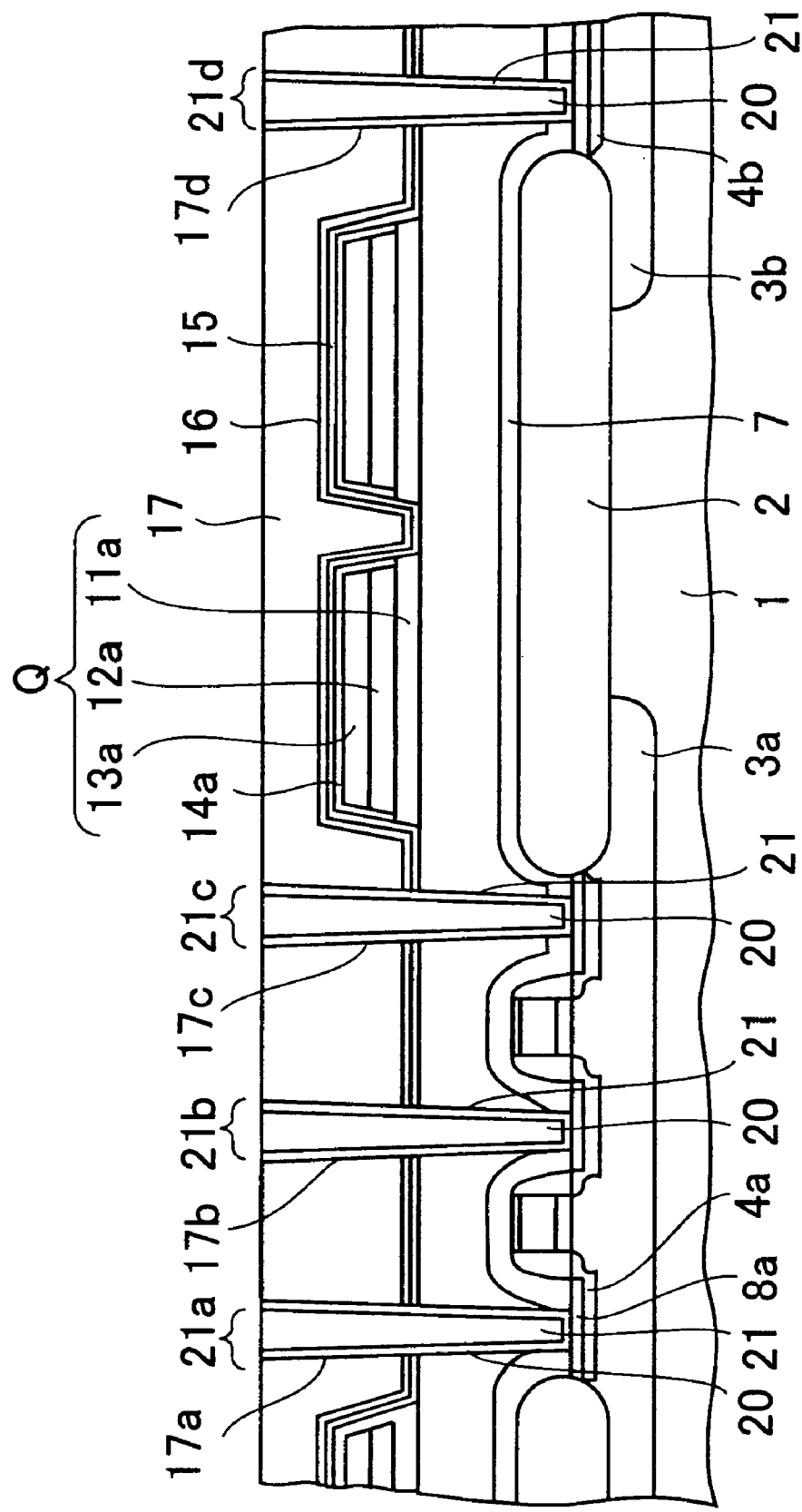
Figure 1R:
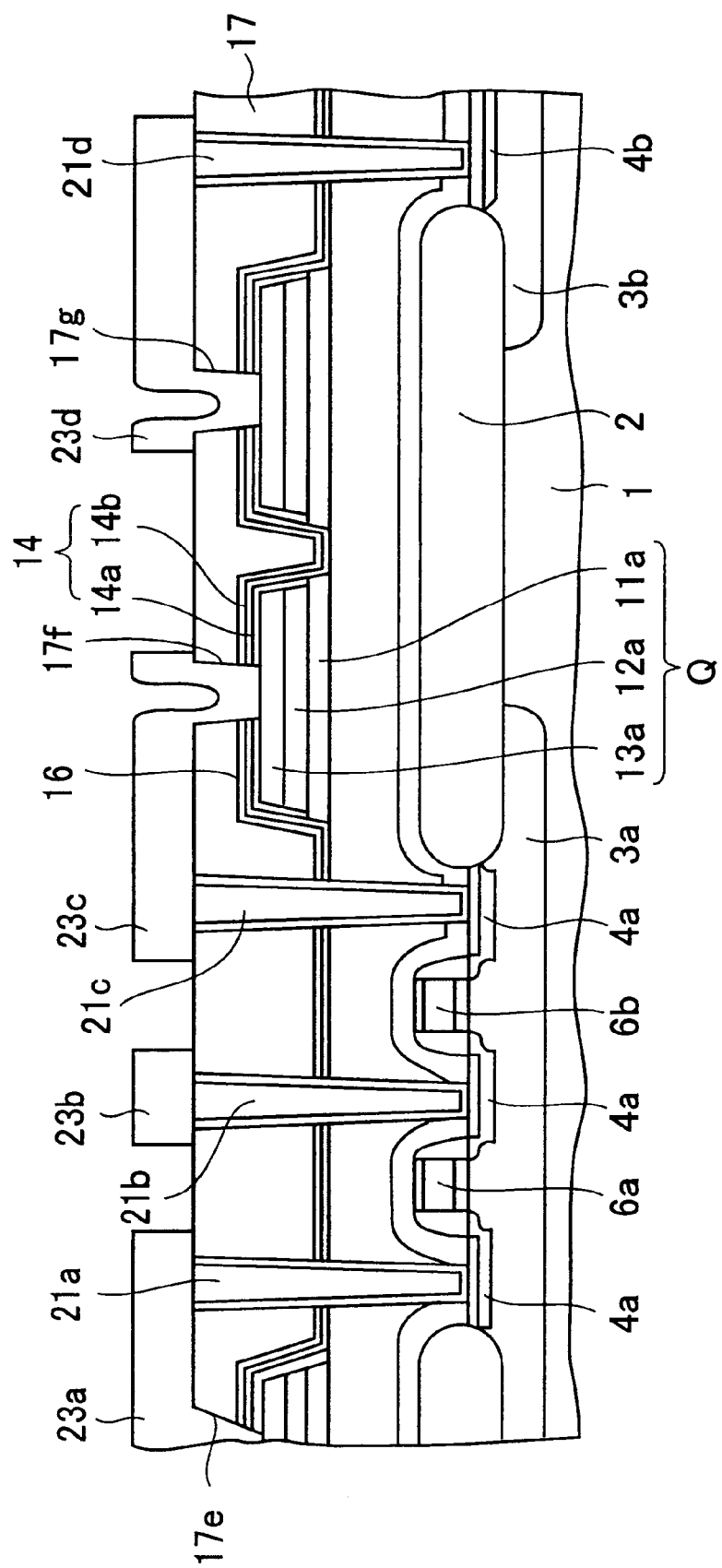

FIGS. 1A to 1R are sectional views showing a method of manufacturing an FeRAM as a semiconductor device according to a first embodiment of the present invention in order of the step.

First, steps up to obtain a sectional structure shown in FIG. 1A will be explained.

As shown in FIG. 1A, a device isolating insulating film 2 is formed on a surface of an n-type or p-type silicon (semiconductor) substrate 1 by the LOCOS (Local Oxidation of Silicon) method. As the device isolating insulating film 2, the STI (Shallow Trench Isolation) method may be employed, other than the LOCOS method.

After such device isolating insulating film 2 is formed, a p-well 3a and an n-well 3b are formed by selectively introducing the p-type impurity and the n-type impurity into a predetermined active region (transistor forming region) of the silicon substrate 1.

Then, a silicon oxide film is formed as a gate insulating film 5 by thermally oxidizing a surface of the active region of the silicon substrate 1.

Then, an amorphous silicon film or a polysilicon film is formed on overall upper surface of the silicon substrate 1. Then, the resistance of the silicon film is lowered by ion-implanting the n-type impurity and the p-type impurity into the silicon film on the p-well 3a and the n-well 3b respectively. Then, gate electrodes 6a, 6b are formed by patterning the silicon film into a predetermined shape by virtue of the photolithography method. The gate electrodes 6a, 6b are arranged each other in almost parallel, and constitute a part of the word line WL.

Then, n-type impurity diffusion regions 4a serving as the source/drain of the n-channel MOS transistors are formed by ion-implanting the n-type impurity into the p-well 3a on both sides of the gate electrodes 6a, 6b. Then, p-type impurity diffusion regions 4b serving as the source/drain of the p-channel MOS transistors (not shown) are formed by ion-implanting the p-type impurity into the n-well 3b.

Then, an insulating film is formed on the overall surface of the silicon substrate 1. Then, the insulating film is left as a sidewall insulating film 10 only on both side portions of the gate electrodes 6a, 6b by etching back the insulating film. As the insulating film, for example, a silicon oxide ($SiO_2$) film is formed by the CVD (Chemical Vapor Deposition) method.

Then, the n-type impurity diffusion regions 4a are made into the LDD (Lightly Doped Drain) structure by implanting the n-type impurity into the p-well 3a again while using the gate electrodes 6a, 6b and the sidewall insulating films 10 as a mask. Also, the p-type impurity diffusion regions 4b are made into the LDD structure by implanting the p-type impurity into the n-well 3b again.

In this case, the individual implantation of the n-type impurity and the p-type impurity is carried out using the resist patterns (not shown).

As described above, the n-MOSFET is constructed by the p-well 3a, the gate electrodes 6a, 6b, the n-type impurity diffusion regions 4a on both sides of the gate electrodes 6a, 6b, etc. Also, the p-MOSFET (not shown) is constructed by the n-well 3b, the p-type impurity diffusion regions 4b, and the gate electrodes (not shown), etc.

Then, a refractory metal film, e.g., a film made of Ti (titanium), Co (cobalt), or the like, is formed on the overall surface. Then, refractory metal silicide layers 8a, 8b are formed on surfaces of the n-type impurity diffusion regions 4a and the p-type impurity diffusion regions 4b respectively by heating this refractory metal film. Then, the unreacted refractory metal film is removed by the wet etching.

Then, a silicon oxide nitride (SiON) film of about 200 nm thickness is formed as a cover insulating film 7 on the overall surface of the silicon substrate 1 by the plasma CVD method. Then, a silicon oxide ($SiO_2$) film of about 1.0 μm thickness is grown as a first interlayer insulating film (first insulating film) 9 on the cover insulating film 7 by the plasma CVD method using TEOS (tetraethoxy silane) gas.

Then, a surface of the first interlayer insulating film 9 is planarized by polishing the surface by virtue of the CMP (Chemical Mechanical Polishing) method.

Next, steps up to form a structure shown in FIG. 1B will be explained hereunder.

First, a titanium (Ti) film and a platinum (Pt) film are formed sequentially on the first interlayer insulating film 9 by the DC sputtering method, and these films constitute a first conductive film 11. In this case, a thickness of the Ti film is set to about 10 to 30 nm, e.g., 20 nm, and a thickness of the Pt film is set to about 100 to 300 nm, e.g., 175 nm. This Ti film play the role to improve the adhesiveness between the Pt film and the first interlayer insulating film 9 and the role to improve the crystallinity of the Pt film.

It should be noted that as the first conductive film 11, a film made of iridium, ruthenium, ruthenium oxide, strontium ruthenium oxide ($SrRuO_3$), or the like may be formed.

Then, a PZT ($Pb(Zr_{1-x}Ti_x)O_3$) film having a thickness of 100 to 300 nm, e.g., 240 nm is formed on the first conductive film 11 by the sputtering method, and this film is used as a ferroelectric film 12.

Then, the silicon substrate 1 is put in the oxygen atmosphere. Then, the crystallizing process of the PZT film constituting the ferroelectric film 12 is carried out by applying the RTA (Rapid Thermal Annealing) process to this PZT film at the temperature of 725° C. for 20 second at a temperature-increasing rate of 125° C./sec, for example.

As the method of forming the ferroelectric film 12, other than the above sputtering method, there are the spin-on method, the sol-gel method, the MOD (Metal Organic Deposition) method, the MOCVD method. Also, as the material constituting the ferroelectric film 12, other than PZT, there are the PZT material such as PLZT (Lead Lanthanum Zirconate Titanate: $Pb_{1-3x/2}La_x$) ($Zr_{-y}Ti_yO_3$) obtained by adding lanthanum (La) into PZT, PLCSZT obtained by adding lanthanum (La), calcium (Ca), and strontium (Sr) into PZT, etc., and the bismuth (Bi) material such as $SrBi_2(Ta_xNb_{1-x})_2O_9$ (where $0<x≦1$), $Bi_4Ti_2O_{12}$, etc.

After the above ferroelectric film 12 is formed, an iridium oxide ($IrO_x$) film is formed as a second conductive film 13 on the ferroelectric film 12 by the sputtering method to a thickness of 100 to 300 nm, e.g., 200 nm. It should be noted that as the second conductive film 13, a platinum (Pt) film or a strontium ruthenium oxide (SRO) film may be formed by the sputtering method.

Next, steps up to obtain the structure shown in FIG. 1C will be explained hereunder.

First, resist patterns (not shown), each having a capacitor upper electrode shape, are formed on the second conductive film 13, and then the second conductive film 13 is patterned by using the resist patterns as an etching mask. Then, the remaining second conductive film 13 is used as capacitor upper electrodes 13a.

Then, after removing the resist patterns, the ferroelectric film 12 is annealed in the oxygen atmosphere at the temperature of 650° C. for 60 second. This annealing is carried out to recover the damage which the ferroelectric film 12 received during the sputtering and the etching.

Figure 2:
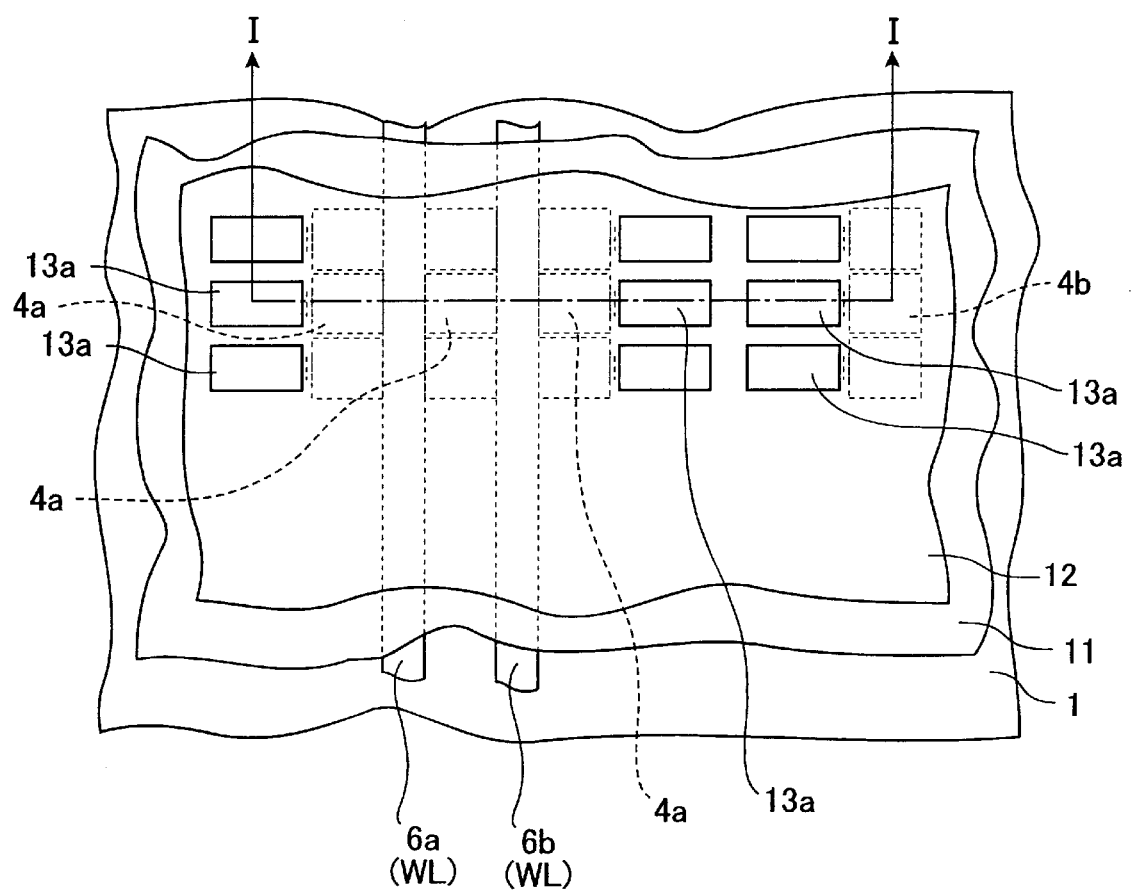
FIG. 2 is a plan view showing the semiconductor device, shown in FIG. 1C, according to the first embodiment of the present invention.

In this case, a plan view of this FIG. 1C is given as shown in FIG. 2, and FIG. 1C corresponds to a sectional view taken along a I—I line in FIG. 2.

Then, as shown in FIG. 1D, resist patterns (not shown) are formed on the capacitor upper electrodes 13a, and then the ferroelectric film 12 is patterned by using the resist patterns as an etching mask. Then, the remaining ferroelectric film 12 is used as capacitor dielectric films 12a. Then, after removing the resist patterns, the capacitor dielectric films 12a are annealed in the oxygen atmosphere at the temperature of 650° C. for 60 second.

Figure 3:
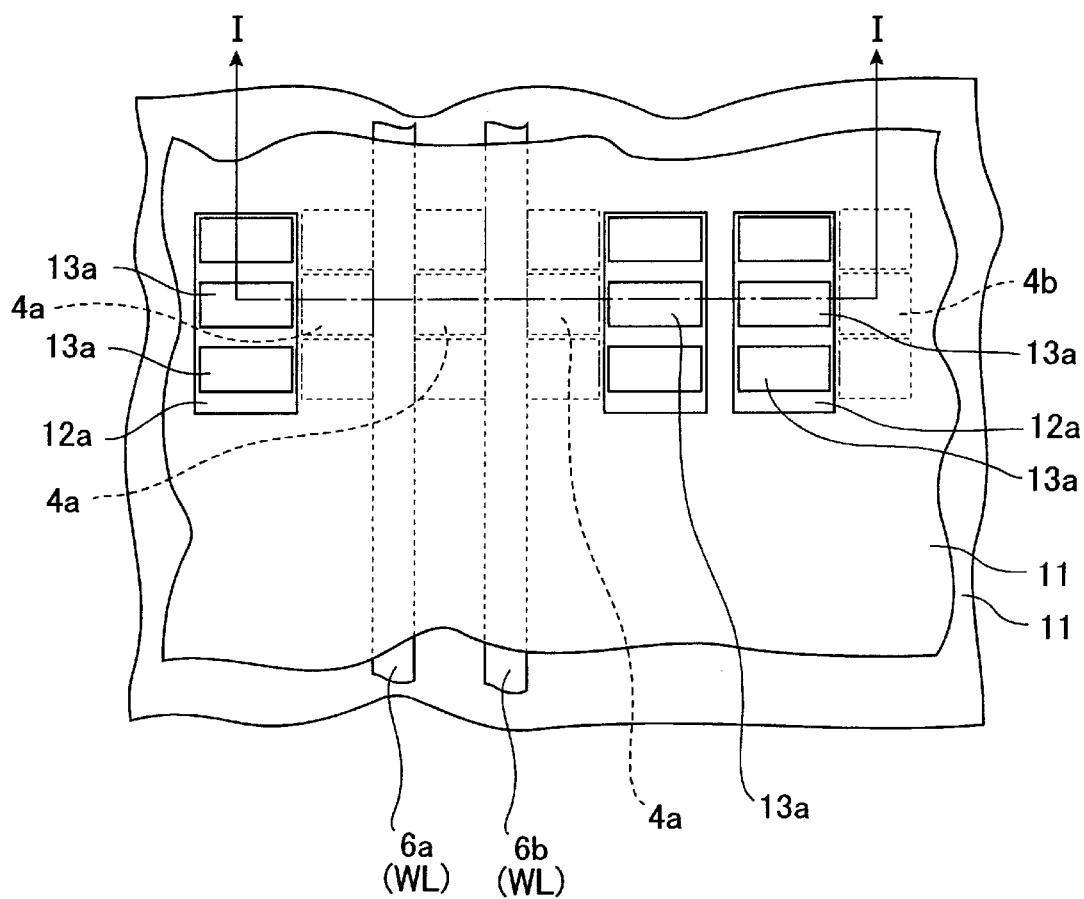
FIG. 3 is a plan view showing the semiconductor device, shown in FIG. 1D, according to the first embodiment of the present invention.

In this case, a plan view of this FIG. 1D is given as shown in FIG. 3, and FIG. 1D corresponds to a sectional view taken along a I—I line in FIG. 3.

Then, as shown in FIG. 1E, an alumina ($Al_2O_3$) film of 50 nm thickness is formed as a lower protection insulating film 14a, which covers the capacitor dielectric films 12a and the capacitor upper electrodes 13a, at the ambient temperature by the sputtering method. This lower protection insulating film 14a is formed to protect the capacitor dielectric films 12a, which are ready to be reduced, from the reducing substance such as the hydrogen and to block the entering of the hydrogen into the inside of the capacitor dielectric films 12a.

By the way, if the bias voltage is applied to the silicon substrate 1 in forming this lower protection insulating film 14a, target atoms tend to be pulled toward the silicon substrate 1 at high speed by the bias voltage, deteriorating the capacitor dielectric films 12a. Accordingly, it is preferable that the bias voltage should not be applied to the silicon substrate 1 in forming this lower protection insulating film 14a. In the present invention, because the bias voltage is not applied, the above disadvantage is not caused.

It should be noted that as the lower protection insulating film 14a, a PLZT film, a PZT film, a titanium oxide film, an aluminum nitride film, a silicon nitride film, or a silicon nitride oxide film may be formed.

Next, steps up to obtain the structure shown in FIG. 1F will be explained hereunder.

First, the film quality of the capacitor dielectric films 12a under the lower protection insulating film 14a is improved by applying the RTA process in the oxygen atmosphere at the temperature of 700° C. for 60 second with the temperature-increasing rate of 125° C./sec.

Then, the resist (not shown) is coated on the lower protection insulating film 14a. Then, the resist is exposed/developed to be left such that the resist covers the capacitor upper electrodes 13a and the capacitor dielectric films 12a. Then, the lower protection insulating film 14a and the first conductive film 11 are patterned by using the resist as an etching mask. Thus, the lower protection insulating film 14a is left on the capacitor upper electrodes 13a and the capacitor dielectric films 12a. Then, the first conductive film 11 left after this patterning is used as capacitor lower electrodes 11a. In this case, the etching of the lower protection insulating film 14a and the first conductive film 11 is carried out by the dry etching using the chlorine as the etching gas.

As a result, capacitors Q each of which is formed by laminating the lower electrode 11a, the capacitor ferroelectric film 12a, and the upper electrode 13a sequentially are formed on the first interlayer insulating film 9.

Figure 4:
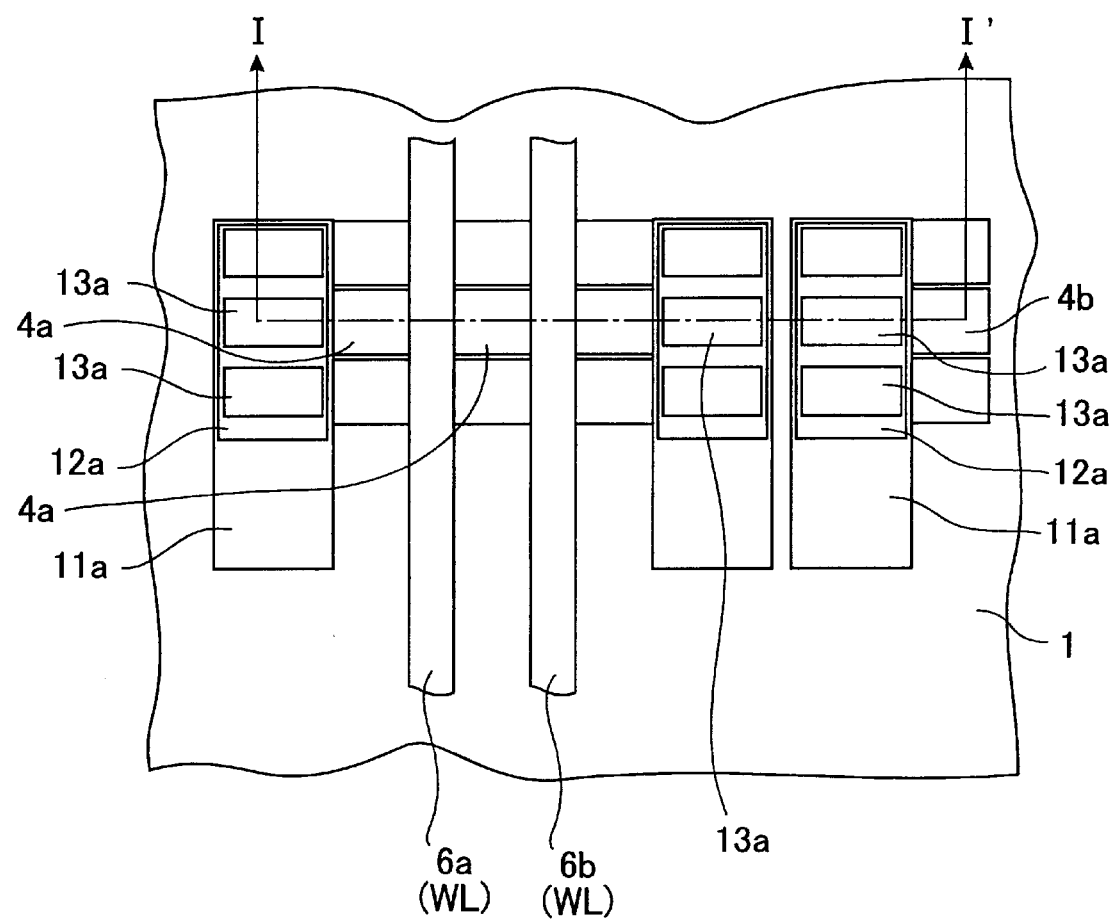
FIG. 4 is a plan view showing the semiconductor device, shown in FIG. 1F, according to the first embodiment of the present invention.

In this case, a plan view of this FIG. 1F is given as shown in FIG. 4, and FIG. 1F corresponds to a sectional view taken along a I—I line in FIG. 4. Note that the lower protection insulating film 14a is omitted in FIG. 4.

Then, as shown in FIG. 1G, an alumina ($Al_2O_3$) film of 20 nm thickness is formed as an upper protection insulating film 14b on the first interlayer insulating film 9 and the lower protection insulating films 14a at the ambient temperature by the sputtering method.

This upper protection insulating film 14b, along with the lower protection insulating film 14a, constitutes a first capacitor protection insulating film 14. Employing such a double-layered structure for the insulating film 14 increases its film thickness, making it more difficult for the hydrogen to enter into the capacitor ferroelectric film 12a. Also, since the upper protection insulating film 14b covers the capacitors Q and the first interlayer insulating film 9 continuously, the reducing substance such as the hydrogen or the like can be prevented from entering into the capacitors Q from the outside via the first interlayer insulating film 9.

Like the case of the lower protection insulating film 14a, if the bias voltage is not applied to the silicon substrate 1 in forming the upper protection insulating film 14b, the deterioration of the capacitor ferroelectric film 12a by the target atoms can be prevented.

Next, steps up to obtain the structure shown in FIG. 1H will be explained hereunder.

Figure 8:
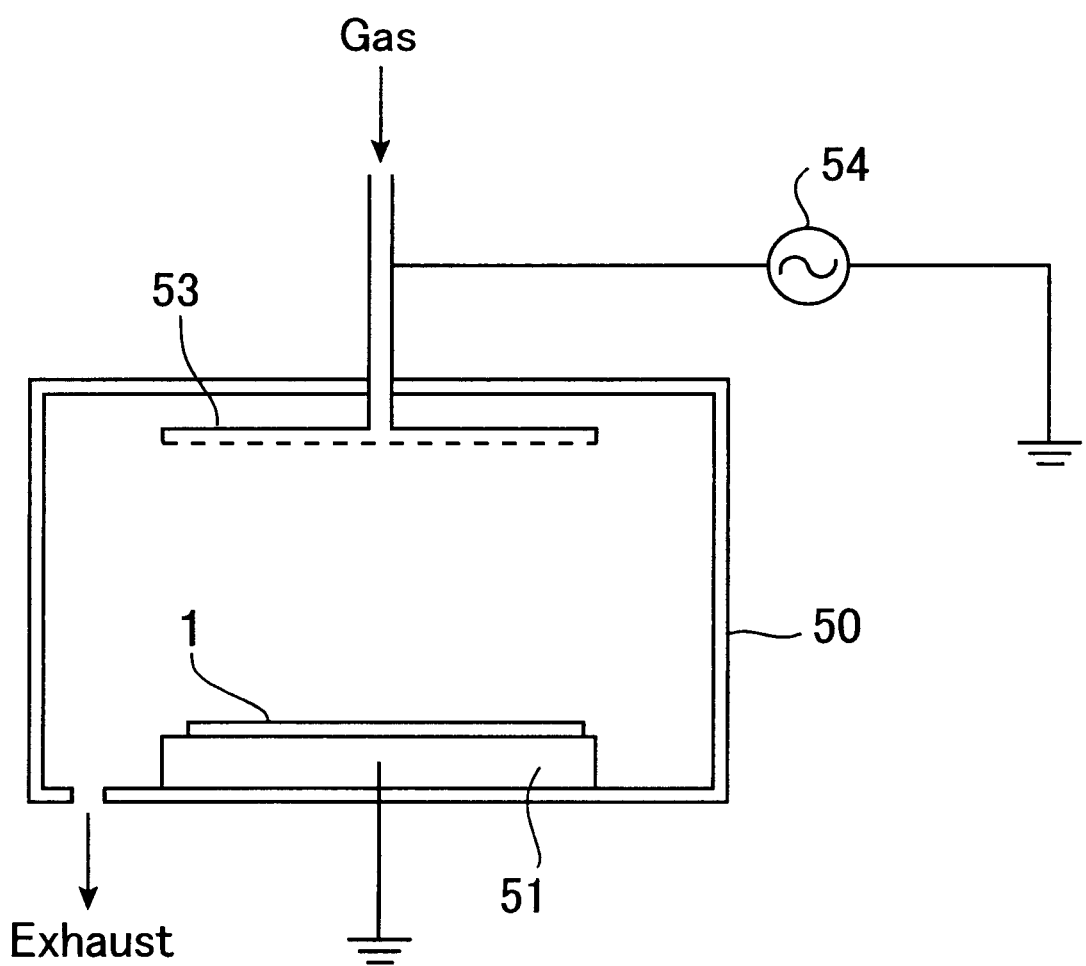
FIG. 8 is a configurative view showing the plasma CVD equipment employed in the steps of manufacturing the semiconductor device according to respective embodiments of the present invention.

First, the silicon substrate 1 is loaded in a chamber 50 of the plasma CVD equipment shown in FIG. 8. A substrate loading table 51 on which the silicon substrate 1 is loaded is grounded, while a gas distributing plate 53 is connected to a high-frequency power supply 54 and the high-frequency power is applied to the gas distributing plate 53.

Then, the film formation is carried out under following conditions.

TEOS gas flow rate . . . 460 sccm

He (carrier gas of TEOS) flow rate . . . 480 sccm $O_2$ flow rate . . . 700 sccm Pressure . . . 9.0 Torr Frequency of the high-frequency power supply 54 . . . 13.56 MHz Power of the high-frequency power supply 54 . . . 400 W Film forming temperature . . . 390° C.

According to this condition, as shown in FIG. 1H, a silicon oxide ($SiO_2$) film of 100 nm thickness is formed as a second capacitor protection insulating film 16 on the first capacitor protection insulating film 14.

Since the substrate loading table 51 (see FIG. 8) is grounded in forming this second capacitor protection insulating film 16, the bias voltage is not applied to the silicon substrate 1. Therefore, the plasmanized reaction gas is never pulled into the silicon substrate 1 by the bias voltage, so that there is no possibility that the capacitor ferroelectric film 12a is deteriorated by the reaction gas.

Then, the moisture contained in the surface and inside of the second capacitor protection insulating film 16 is discharged to the outside by heating this insulating film 16 in the vacuum chamber (not shown) at the temperature of 350° C. After this dehydrating process, the second capacitor protection insulating film 16 is exposed to the $N_2O$ plasma to extract the moisture and improve the film quality. As a result, the deterioration of the capacitors caused by the heat and the moisture in the subsequent steps can be prevented.

Such dehydrating process and the plasma process may be executed in the same chamber. In this chamber, a supporting electrode on which the silicon substrate 1 is loaded and an opposing electrode that opposes to the supporting electrode are arranged, and the high-frequency power supply can be connected to the opposing electrode. Then, with the $N_2O$ gas being introduced into the chamber, first the dehydrating process of the insulating film is executed under the condition that the high-frequency power is not applied to the opposing electrode, and then the $N_2O$ plasma process of the insulating film is executed by generating the $N_2O$ plasma between the electrodes under the condition that the high-frequency power is applied to the opposing electrode. In this case, the frequency of the high-frequency power supply is 13.56 MHz and the power of the high-frequency power supply is 300 W. Also, the $N_2O$ flow rate is 700 sccm.

Though it is preferable to employ the $N_2O$ plasma in the plasma process performed after dehydration process, the $N_2$ plasma, or the like may be employed in the alternative. This holds also in the steps described later.

Figure 10:
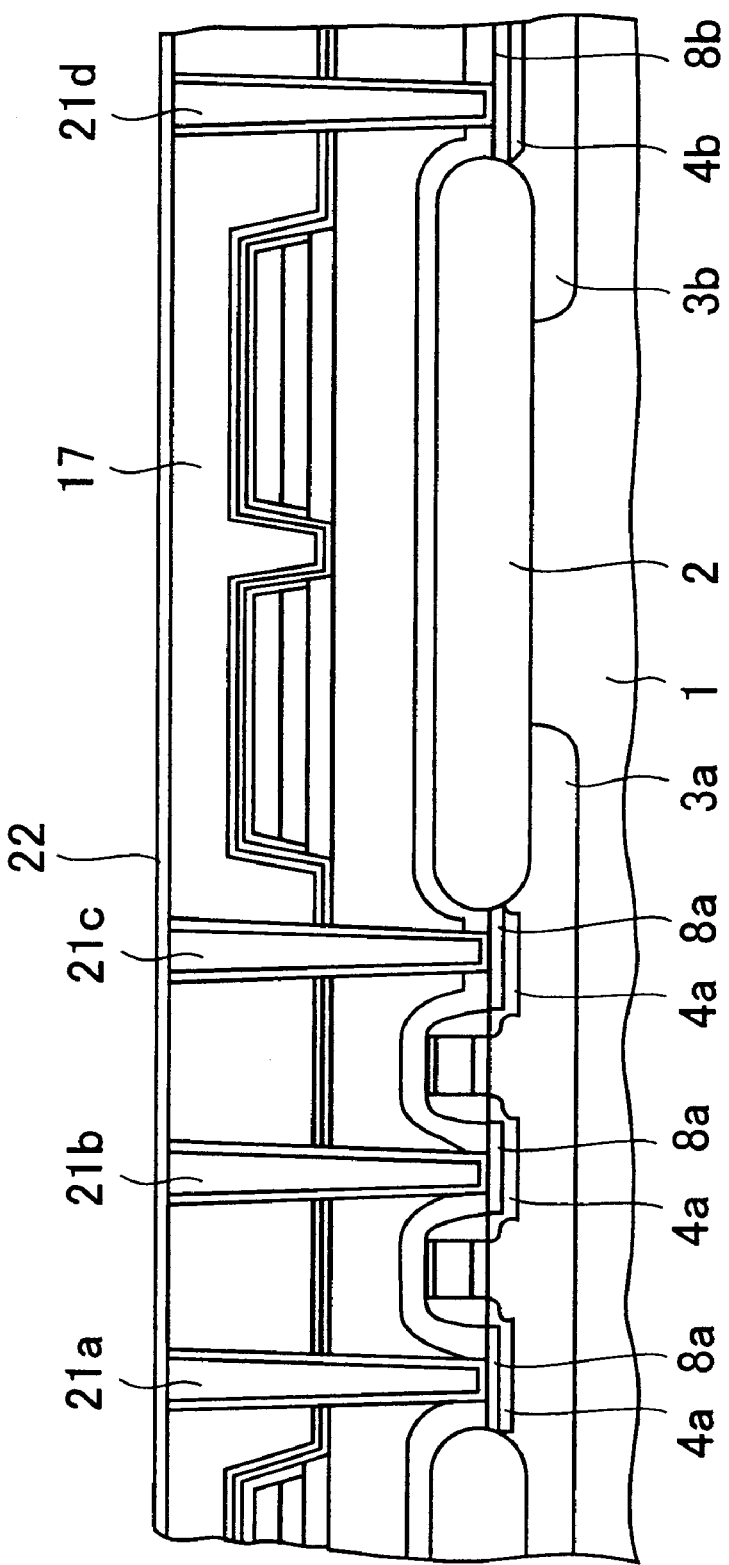
FIGS. 10A and 10B are sectional views for explaining the conditions that are satisfied by a thickness of a second capacitor protection insulating film in the steps of manufacturing the semiconductor device according to respective embodiments of the present invention.
Figure 10A:
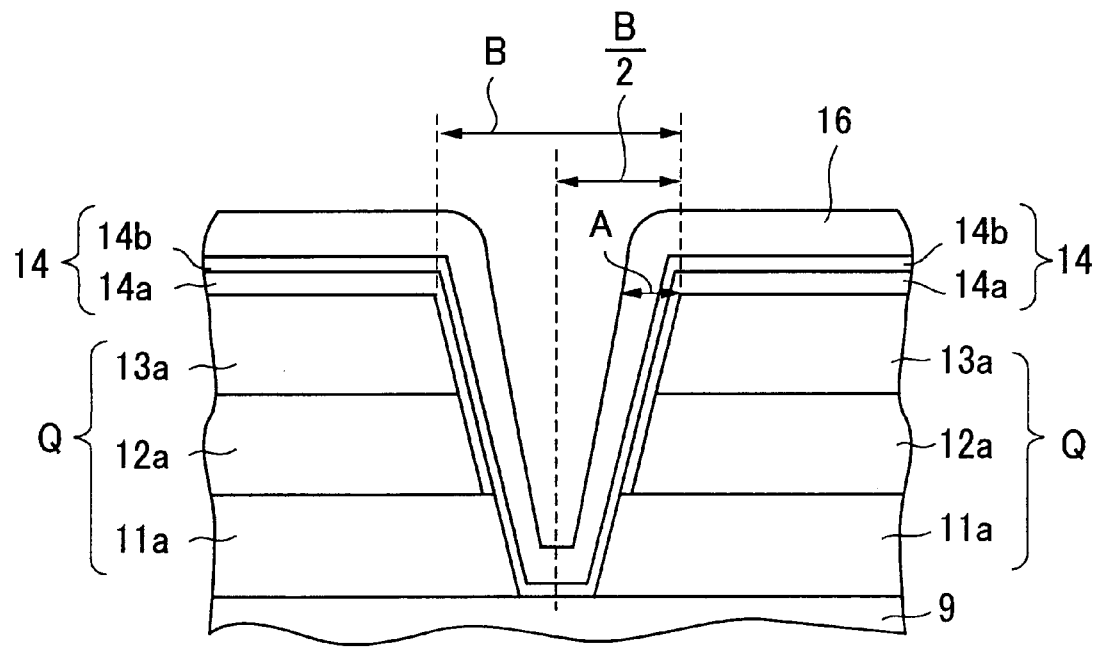

Preferably, a thickness of the second capacitor protection insulating film 16 is set as shown in FIG. 10A, than set arbitrary.

Figure 10B:
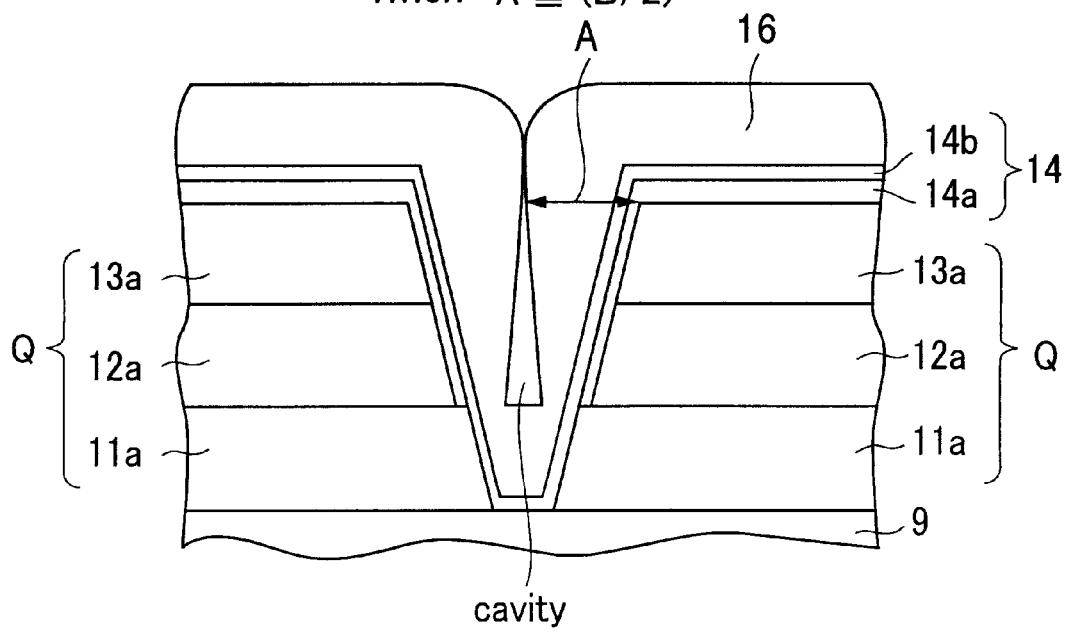

In FIGS. 10A and 10B, the minimum interval between the upper electrodes 13a is denoted by B and a total film thickness of the first capacitor protection insulating film 14 and the second capacitor protection insulating film 16 is denoted by A, when a plurality of capacitors Q are formed.

Here, if A, B do not satisfy a relationship of A<(B/2) (FIG. 10B), the cavity is formed between the capacitors Q and such cavity cannot be buried with the insulating film in the subsequent step, which is not preferable.

In contrast, in the present invention, as shown in FIG. 10A, since the capacitors Q are formed to satisfy the above relationship of A<(B/2), the cavity is not formed between the capacitors Q and the space between the capacitors Q can be buried desirably by the insulating film in the subsequent step. This advantage can also be achieved in the second embodiment described later.

Next, steps up to obtain the structure shown in FIG. 1I will be explained hereunder.

Figure 9:
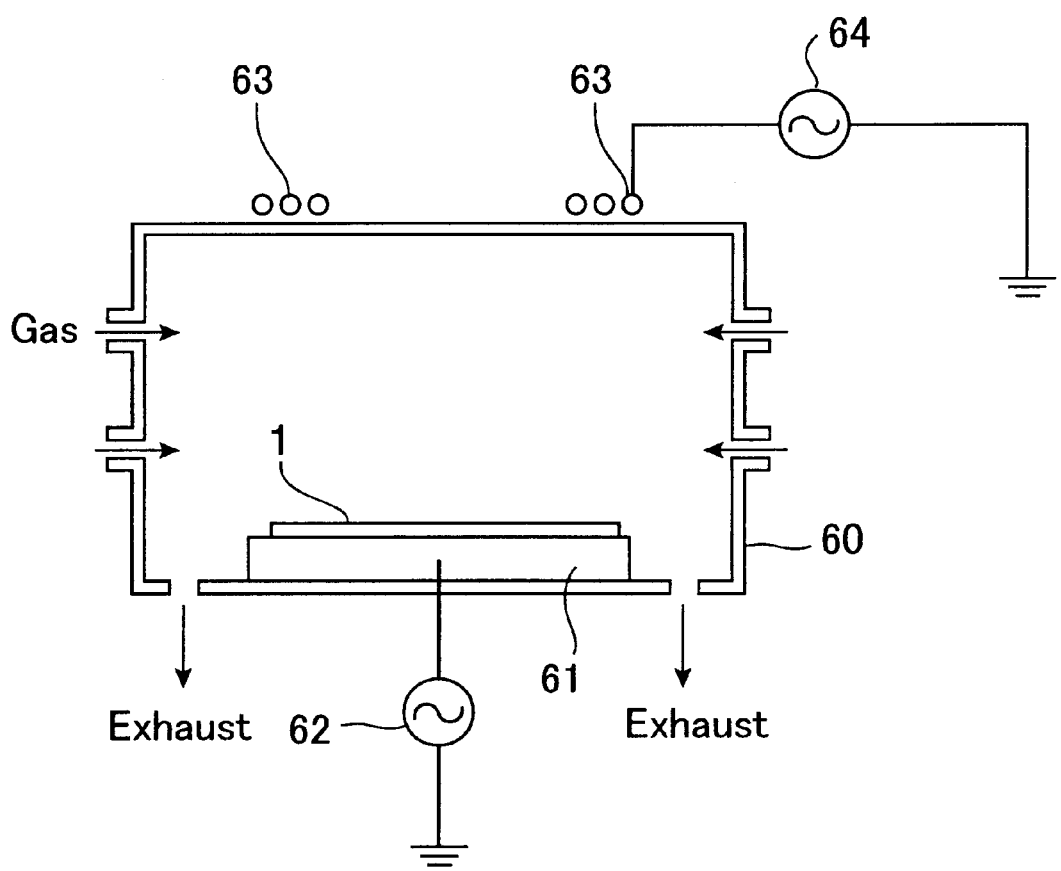
FIG. 9 is a configurative view showing the HDPCVD equipment employed in the steps of manufacturing the semiconductor device according to respective embodiments of the present invention.

First, the silicon substrate 1 is loaded in a chamber 60 of the high density plasma CVD (HDPCVD) equipment shown in FIG. 9. The HDPCVD method generally refer to the CVD method that is carried out in the plasma atmosphere whose plasma density is about $1\times10^{11}$ to $1\times10^{13}$ cm$^{-3}$. This plasma density is higher than the plasma density (about $1\times10^9$ to $1\times10^{10}$ cm$^{-3}$) in the usual plasma CVD method that is used to form the second capacitor protection insulating film 16. Furthermore, in this HDPCVD method, the film formation is carried out at the low pressure of about 1 mTorr to 7 mTorr to longer the mean free path of the ion. This pressure is lower than the pressure (about 2 to 10 Torr) of the above usual plasma CVD method.

Then, in this HDPCVD method, a first high-frequency power supply 64 is connected to a coil 63 provided over the chamber 60, and a second high-frequency power supply 62 is connected to a substrate loading table 61. It should be noted the coil 63 is wound on the plane that is parallel to the principal surface of the silicon substrate 1, and a cross section of the coil 63 is shown in FIG. 9.

By applying the high-frequency power to the substrate loading table 61 as above, the bias voltage is applied to the silicon substrate 1, so that the plasmanized reaction gas is pulled into the silicon substrate 1. In such reaction gas, the component that sputters the deposited film is contained together with the component that contributes the deposition of the film. Due to this sputtering action, the deposition and the sputter of the film are carried out simultaneously at the shoulder portions of the capacitor, so that it can be prevented that the film is formed thick at the shoulder portions. As a result, the thickness of the film on the side surfaces of the capacitors is evened uniformly, and the second insulating film having the good filling property can be formed between the capacitors that have the high aspect ratio.

The film formation is conducted by using such HDPCVD method under following conditions.

$SiH_4$ flow rate . . . 69 sccm $O_2$ flow rate . . . 300 sccm

Ar flow rate . . . 300 sccm

Pressure . . . 6.2 mTorr

Frequency of the first high-frequency power supply 64 . . . 13.56 MHz

Power of the first high-frequency power supply 64 . . . 3000 W

Frequency of the second high-frequency power supply 62 . . . 2 MHz

Power of the second high-frequency power supply 62 . . . 1200 W

Film forming temperature . . . 250° C.

According to this condition, as shown in FIG. 1I, a silicon oxide ($SiO_2$) film of about 800 nm thickness is formed as a second interlayer insulating film (second insulating film) 17 with the good filling property on the second capacitor protection insulating film 16. Since the second interlayer insulating film 17 has the good filling property, the cavity is never formed in the second interlayer insulating film 17 between the capacitors Q even when the interval between the capacitors Q is narrowed with the progress of the higher integration.

It should be noted that in place of the above $SiH_4$, the silane gas such as $Si_2H_6$, $Si_3H_8$, or the like, the chlorine-containing gas such as $SiCl_4$, or the like may be employed alternatively.

In addition, F (fluorine), P (phosphorus), B (boron), or the like may be added to the second interlayer insulating film 17, if necessary. In this case, $C_2F_6$, $B_2H_6$, $B(OCH_3)_3$, $B(OC_2H_5)_3$, $PH_3$, or the like may be added to the reaction gas along with the above silane gas. These can be applied similarly to the second embodiment described later.

As described above, it may be considered that because the bias voltage is applied to the substrate in the HDPCVD method, the hydrogen ion H$^+$ dissociated from $SiH_4$ is pulled into the silicon substrate 1. Therefore, the capacitor ferroelectric film 12a is considered to be easily deteriorated by the hydrogen ion H$^+$ than the plasma CVD method in which the bias voltage is not applied to the substrate.

Then, it may be considered that the imprint characteristic of the capacitor is deteriorated due to the deterioration of the capacitor ferroelectric film 12a. The deterioration of the imprint characteristic refers to such a problem that after writing some signal (e.g., "0") into the capacitor and leaving it for some period of time, and further writing opposite signal (e.g., "1") into the capacitor, the opposite signal is made difficult to be read out. That is, the deterioration of the imprint characteristic is such a state that the opposite direction signal is imprinted into the capacitor and thus the opposite signal is hard to write.

In order to confirm the influence of such bias voltage, the inventors of the present invention conducted the following experiment. In this experiment, the second interlayer insulating films 17 were formed with two method, HDPCVD method and CVD method applying no bias, and the deterioration of imprint characteristics of the second interlayer insulating films 17 are compared with each other. In the plasma CVD method, the reaction gas containing TEOS was employed. Also, the second capacitor protection insulating film 16 was not formed, and the second interlayer insulating film 17 is formed directly on the first capacitor protection insulating film 14.

Figure 11:
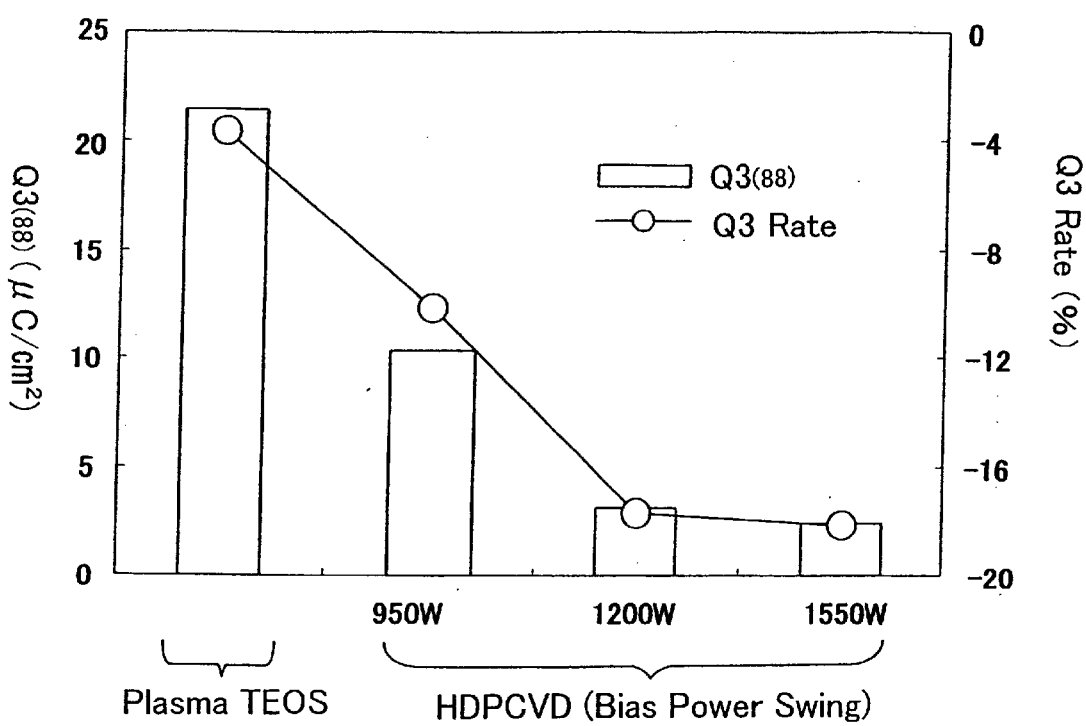
FIG. 11 is a graph showing differences in the damage of the capacitor Q between the case where the second interlayer insulating film is formed while applying the bias voltage and the case where the second interlayer insulating film is formed while not applying the bias voltage, during the steps of manufacturing the semiconductor device according to the first embodiment of the present invention.

The results are shown in FIG. 11. In FIG. 11, a $Q3_{(88)}$ ($\mu C/cm^2$) of an ordinate on the left side denotes difference in the polarization charge after the opposite signal is written into two pairs of capacitors in the 2-transistor/2-capacitor type semiconductor device and then the capacitors are baked at 150° C. for 88 hours. Also, a Q3 rate (%) of an ordinate on the right side denotes a deterioration ratio of the capacitor after an e hour (e=natural logarithm) elapsed. That is, as the value of $Q3_{(88)}$ becomes larger and the absolute value of the Q3 rate becomes smaller, the imprint characteristic can be said to be excellent.

As shown in FIG. 11, when the bias voltage is not applied (plasma TEOS), the imprint characteristic becomes best. Then, when the HDPCVD is employed, the imprint characteristic becomes worse. In particular, the imprint characteristic becomes worse as the bias voltage (the high-frequency voltage applied to the substrate loading table 61 (see FIG. 9)) is increased.

Accordingly, it becomes apparent that if the second interlayer insulating film 17 is formed while applying the bias voltage, the capacitors Q are deteriorated then the case where the bias voltage is not applied. In addition, it becomes apparent that, as shown in FIG. 11, the deterioration of the capacitors Q becomes enormous if the bias voltage becomes larger.

By the way, it is considered that the hydrogen ion $H^+$ cannot be sufficiently blocked by providing only the first capacitor protection insulating film 14 (see FIG. 1I) made of alumina and thus the deterioration of the capacitor ferroelectric film 12a is caused.

In contrast, in the present invention, since the second capacitor protection insulating film 16 is further formed on the first capacitor protection insulating film 14, the collision energy of the hydrogen ion $H^+$ is absorbed by the second capacitor protection insulating film 16 and thus the speed of the $H^+$ is decreased. Accordingly, the hydrogen ion $H^+$ can be blocked by the underlying first capacitor protection insulating film 14, so that the deterioration of the capacitor ferroelectric film 12a due to the hydrogen ion $H^+$ can be prevented.

In addition, since the second capacitor protection insulating film 16 formed by using TEOS has the good coverage, the collided hydrogen ion $H^+$ can be absorbed at the upper portion and the side portion of the capacitor Q equally.

Further, since TEOS is hard to generate the reducing hydrogen rather than $SiH_4$, there is no possibility that the capacitor Q is deteriorated by the hydrogen.

It should be noted that the plasma process may be applied to the second interlayer insulating film 17, if necessary. Since the conditions for this plasma process are similar to those for the second capacitor protection insulating film 16, such conditions will be omitted here.

Meanwhile, since the second interlayer insulating film 17 is formed for the purpose of burying the spaces between the capacitors Q, there is no need to form the second interlayer insulating film 17 unnecessarily thick. If the second interlayer insulating film 17 is formed excessively thick, the film forming time is prolonged. Therefore, even if the second capacitor protection insulating film 16 is provided, it is possible that the capacitor ferroelectric film 12a is exposed to the hydrogen ion $H^+$ and the sputter ion for a long time and is subjected to the damage. Therefore, it is preferable that the film thickness of the second interlayer insulating film 17 be set thicker than a height of the capacitor Q of about 600 nm (≈a total film thickness of the lower electrode 11a, the capacitor ferroelectric film 12a, and the upper electrode 13a) but be set thinner than a film thickness obtained by adding 1 μm to the height of the capacitor Q (=1600 nm). According to such film thickness, the spaces between the capacitors Q can be buried with the second interlayer insulating film 17 while suppressing the damage of the capacitor ferroelectric film 12a maximally.

Then, as shown in FIG. 1J, a silicon oxide ($SiO_2$) film of about 700 nm thickness is formed as a third insulating film 18 on the second interlayer insulating film 17. This third insulating film 18 is formed by using the plasma CVD equipment shown in FIG. 8, and its film forming conditions is as follows:

TEOS gas flow rate . . . 460 sccm

He (carrier gas of TEOS) flow rate . . . 480 sccm $O_2$ flow rate . . . 700 sccm Pressure . . . 9.0 Torr Frequency of the high-frequency power supply 54 . . . 13.56 MHz Power of the high-frequency power supply 54 . . . 400 W Film forming temperature . . . 390° C.

Then, as shown in FIG. 1K, surfaces of the second interlayer insulating film 17 and the third insulating film 18 are planarized by polishing them by virtue of the CMP method. Such planarization is carried out until a thickness of the second interlayer insulating film 17 on the upper electrode 13a is reduced to 200 nm.

At this time, because the third insulating film 18 is formed, the polished film thickness can be increased. Accordingly, the distribution of the film thickness after the polishing can be uniformized.

The moisture, contained either in the slurry used in the planarization by this CMP method or in the cleaning liquid used in the subsequent cleaning, is adhered onto the surface of the second interlayer insulating film 17 or is absorbed into the inside of the second interlayer insulating film 17. In view of this, the second interlayer insulating film 17 is exposed to the $N_2O$ plasma to extract the moisture and improve the film quality. According to this, the deterioration of the capacitor caused by the heat and the moisture in the subsequent steps can be prevented.

Then, as shown in FIG. 1L, a resist 19 is coated on the second interlayer insulating film 17. Then, hole forming windows 19a to 19d are formed on the impurity diffusion regions 4a, 4b respectively by exposing/developing the resist 19.

Then, contact holes 17a to 17d are formed on the impurity diffusion regions 4a, 4b by dry-etching the second interlayer insulating film 17, the second capacitor protection insulating film 16, the upper protection insulating film 14b, the first interlayer insulating film 9, and the cover insulating film 7. At this time, gas mixture of Ar, $C_4F_8$, and $O_2$ are used as an etching gas for etching the second interlayer insulating film 17, the second capacitor protection insulating film 16, the upper protection insulating film 14b, and the first interlayer insulating film 9. Also, when the cover insulating film 7 made of silicon nitride oxide is etched, the gas mixture which is prepared by adding $CF_4$ to the above gas mixture is employed as the etching gas.

Here, the contact holes 17a to 17d are formed like a taper shape whose upper portion is wide and whose lower portion is narrow. A diameter of the contact holes at the middle in the depth direction is about 0.5 μm.

Figure 5:
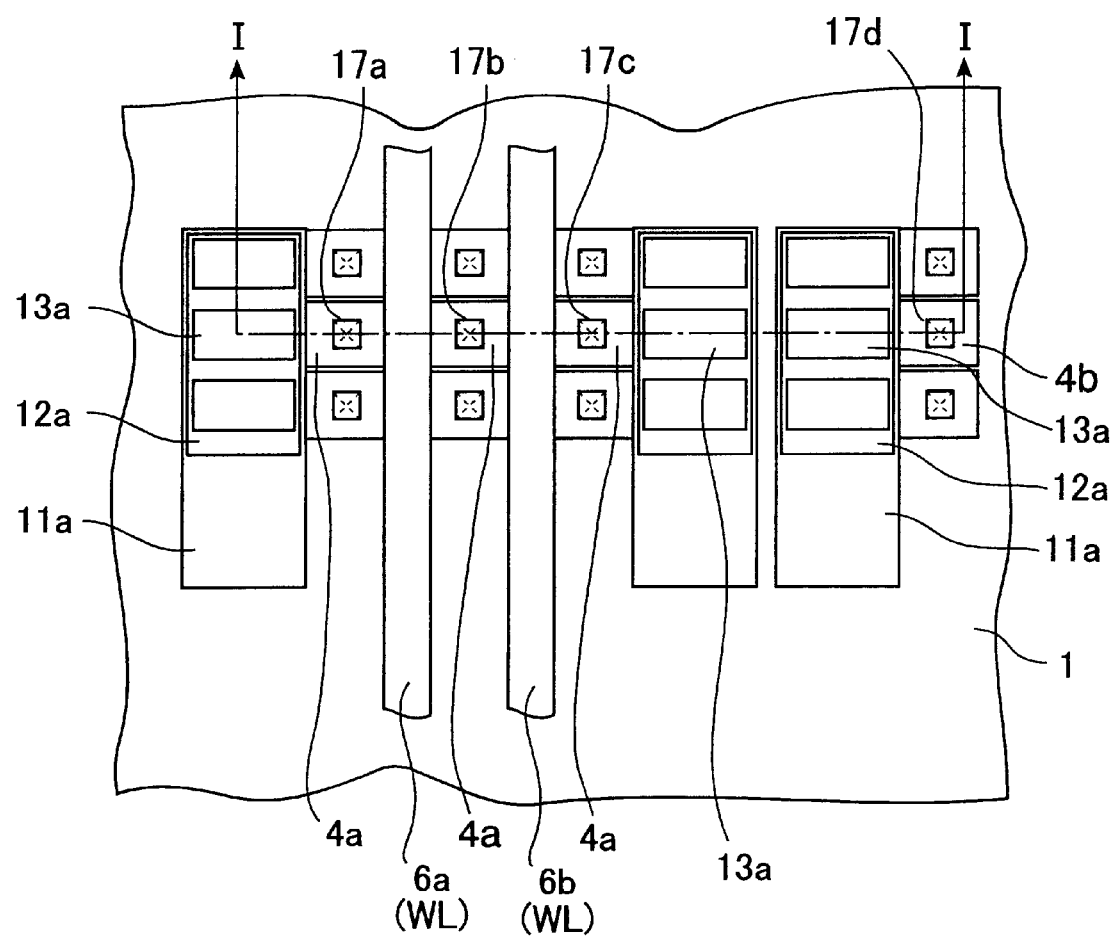
FIG. 5 is a plan view showing the semiconductor device, shown in FIG. 1L, according to the first embodiment of the present invention.

In this case, a plan view of this FIG. 1L is given as shown in FIG. 5, and FIG. 1L corresponds to a sectional view taken along a I—I line in FIG. 5.

Then, after removing the resist 19, as shown in FIG. 1M, a titanium (Ti) film of 20 nm thickness and a titanium nitride (TiN) film of 50 nm thickness are formed on the second interlayer insulating film 17 and inner surfaces of the contact holes 17a to 17d by the sputtering method. These films constitute a glue film 20. Then, a tungsten film 21 is formed on the glue film 20 by the CVD method using the mixed gas consisting of a tungsten hexafluoride ($WF_6$) gas, argon, and hydrogen. In this case, a silane ($SiH_4$) gas is also employed in the initial stage of growing the tungsten film 21. The tungsten film 21 has a thickness that can bury perfectly each contact holes 17a to 17d, e.g., about 500 nm on the second interlayer insulating film 17.

It should be noted that since the contact holes 17a to 17d have a taper shape, the cavity is difficult to be formed in the tungsten film 21 buried in the contact holes 17a to 17d.

Then, as shown in FIG. 1N, the tungsten film 21 and the glue film 20 on the second interlayer insulating film 17 are removed by the CMP method, leaving them only in the contact holes 17a to 17d. The tungsten film 21 and the glue film 20 in the contact holes 17a to 17d are used as plugs 21a to 21d. Here, if the etching-back is employed instead of the CMP method, different etching gases are required in the etching of the tungsten film 21 and the etching of the glue film 20 respectively. As a result, it takes much time to manage the etching.

Then, in order to remove the moisture adhered onto the surface of the second interlayer insulating film 17 or percolated into the inside thereof either during the steps of the cleaning process after the formation of the contact holes 17a to 17d or during the cleaning process after the CMP, etc., the second interlayer insulating film 17 is annealed in the vacuum chamber (not shown) at the temperature of 390° C. to discharge the moisture to the outside. After such dehydrating process, the annealing, by which the second interlayer insulating film 17 is exposed to the $N_2$ plasma to improve the film quality, is executed for two minute, for example. Here, the reason why the $N_2O$ plasma is not employed but the $N_2$ plasma is employed is not only to prevent the etching of the tungsten film 21 in the contact holes 17a to 17d and the deterioration of the capacitor due to the dehydration but also to prevent the peeling-off of the films constituting the capacitor Q due to the thermal stress. The peeling-off of the film is generated by the difference in the thermal stress between the films constituting the capacitor Q and neighboring films.

Then, as shown in FIG. 10, an SiON film of 100 nm thickness, for example, is formed on the second interlayer insulating film 17 and the plugs 21a to 21d by the plasma CVD method. This SiON film is formed using the gas mixture consisting of silane ($SiH_4$) and $N_2O$, and is used as an oxidation prevention insulating film 22 that prevents the oxidation of the plugs 21a to 21d.

Then, as shown in FIG. 1P, the oxidation prevention insulating film 22, the second interlayer insulating film 17, the second capacitor protection insulating film 16, and the first capacitor protection insulating film 14 are patterned by the photolithography method. Thus, contact holes 17e to 17g reaching the upper electrode 13a of the capacitor Q are formed.

After this, the film quality of the capacitor ferroelectric film 12a is improved by annealing the capacitor ferroelectric film 12a in the oxygen atmosphere at 550° C. for 60 minute. In this case, the oxidation of the plugs 21a to 21d can be prevented by the oxidation prevention insulating film 22.

Figure 6:
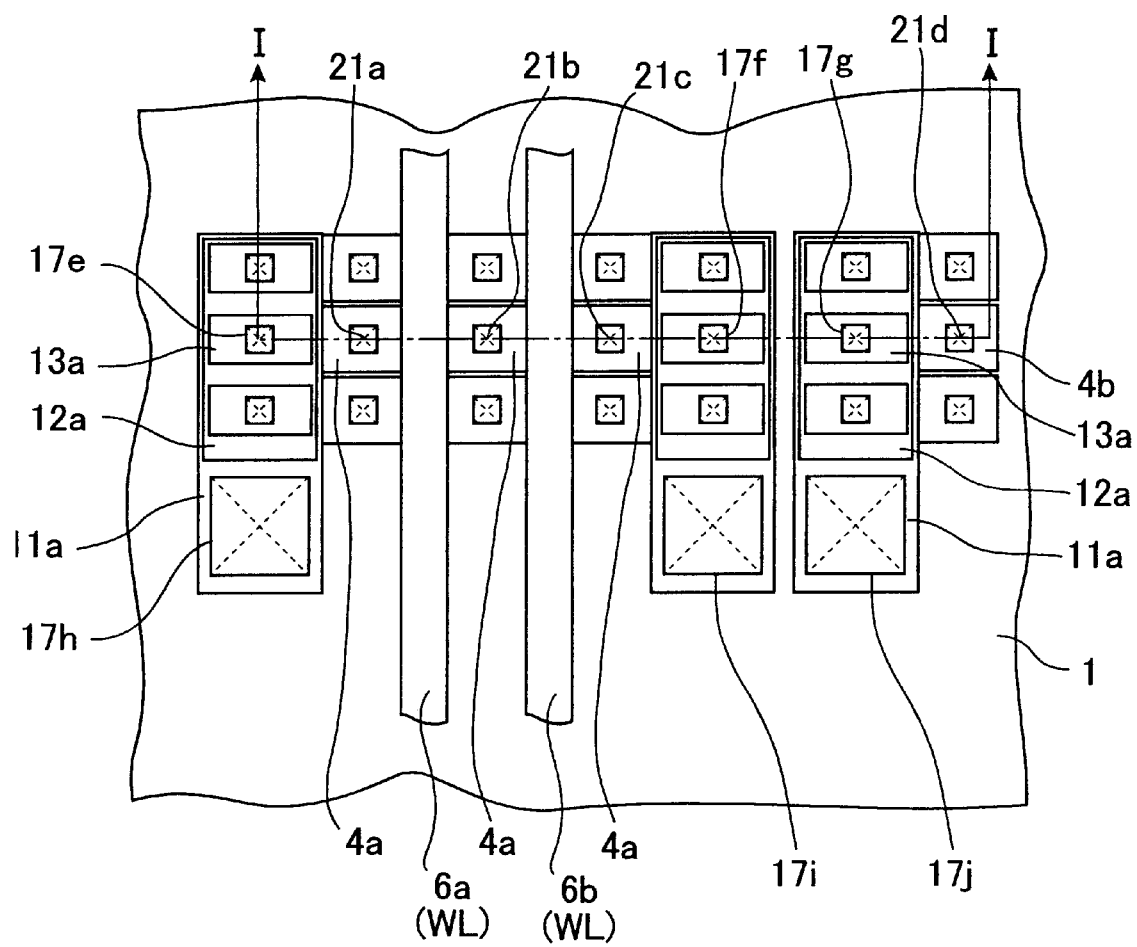
FIG. 6 is a plan view showing the semiconductor device, shown in FIG. 1P, according to the first embodiment of the present invention.

In this case, a plan view of this FIG. 1P is given as shown in FIG. 6, and FIG. 1P corresponds to a sectional view taken along a I—I line in FIG. 6. As shown in FIG. 6, the contact holes 17e to 17g as well as lower electrode contact holes 17h to 17j are formed on the lower electrodes 11a respectively.

Then, as shown in FIG. 1Q, the SiON oxidation prevention insulating film 22 is dry-etched by using the CF gas.

Then, each surfaces of the plugs 21a to 21d and the upper electrodes 13a are etched by about 10 nm by the RF etching method to expose their cleaned surfaces. Then, as shown in FIG. 1R, a conductive film having a quadruple-layered structure containing aluminum is formed on the second interlayer insulating film 17, the plugs 21a to 21d, and the contact holes 17e to 17g of the capacitors Q by the sputter method. The conductive film consists of a titanium nitride film of 50 nm thickness, a copper-containing (0.5%) aluminum film of 500 nm thickness, a titanium film of 5 nm thickness, and a titanium nitride film of 100 nm thickness sequentially from the bottom.

Then, as shown in FIG. 1R, a conductive contact pad 23b and first-layer metal wirings 23a, 23c, 23d are formed by patterning the conductive film by means of the photolithography method. The first-layer metal wirings 23a, 23c, 23d are connected electrically to the upper electrode 13a via the contact holes 17e to 17g.

Figure 7:
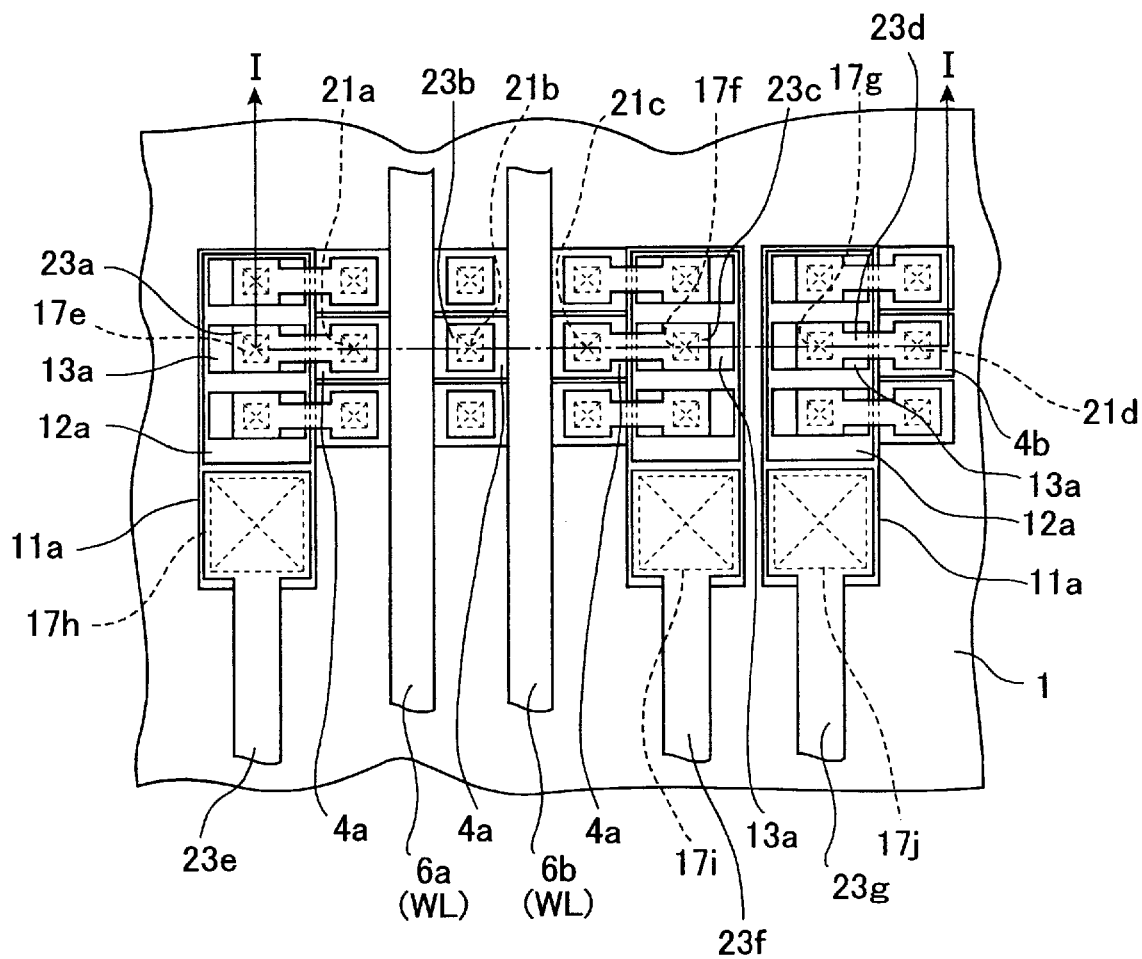
FIG. 7 is a plan view showing the semiconductor device, shown in FIG. 1R, according to the first embodiment of the present invention.

In this case, a plan view of this FIG. 1R is given as shown in FIG. 7, and FIG. 1R corresponds to a sectional view taken along a I—I line in FIG. 7. As shown in FIG. 7, the above conductive film is also formed in the lower electrode contact holes 17h to 17j and serves as first-layer metal wirings 23e to 23g that are electrically connected to the lower electrode 11a.

Then, an insulating film (not shown) for covering the conductive contact pad 23b, the first-layer metal wirings 23a, 23c, 23d, and the second interlayer insulating film 17 is formed. Then, a contact hole is formed on the conductive contact pad 23b by patterning the insulating film by virtue of the photolithography method. Then, a plug having a double-layered structure consisting of a TiN film and a tungsten film is formed in the contact hole. Then, a second-layer metal wiring electrically connected to the plug is formed on the insulating film.

According to the embodiment described above, as already shown in FIG. 1I, after the first capacitor protection insulating film 14 for covering the capacitors Q is formed, the second capacitor protection insulating film 16 is formed thereon, and then the second interlayer insulating film 17 is formed by the HDPCVD method.

By performing such a process, the collision energy of the hydrogen ion $H^+$ and the sputter ion being generated by the HDPCVD method is absorbed by the second capacitor protection insulating film 16 and thus their speed is decreased. As a result, the underlying first capacitor protection insulating film 14 can block the above ions, and thus the deterioration of the capacitor ferroelectric film 12a due to the above ions can be prevented.

Figure 12:
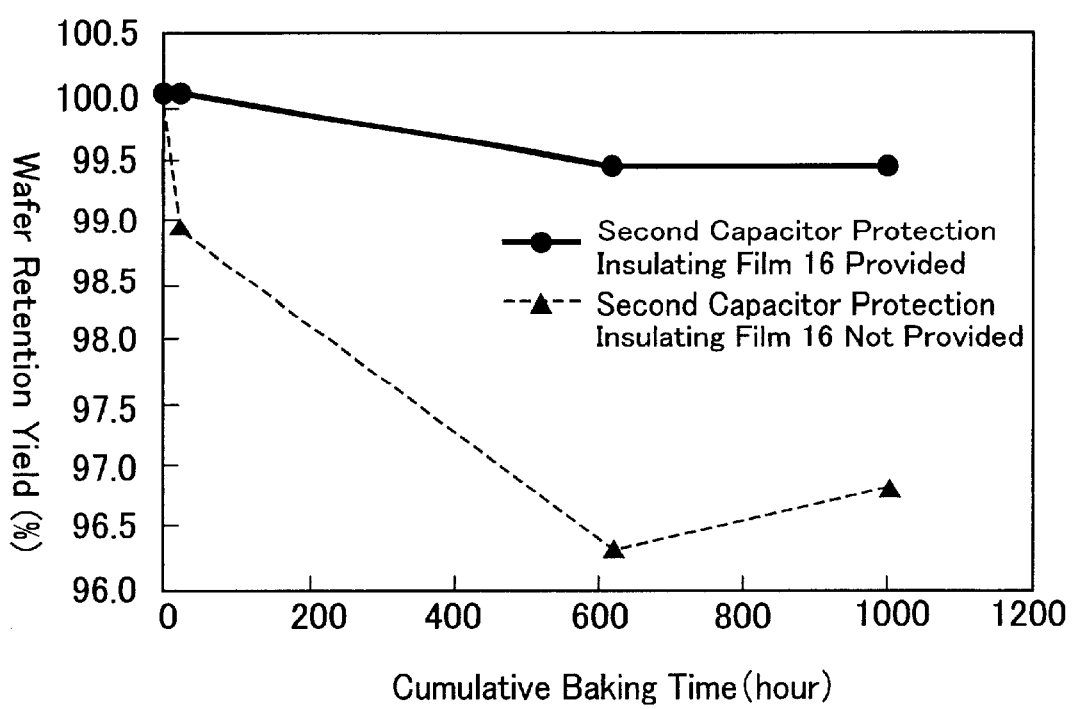
FIG. 12 is a graph showing differences in the damage of the capacitor Q between the case where the second capacitor protection insulating film is formed and the case where the second capacitor protection insulating film is not formed, during the steps of manufacturing the semiconductor device according to the first embodiment of the present invention.

FIG. 12 is a graph showing results of the experiment that was made to verify the effects of the second capacitor protection insulating film 16.

This experiment was applied to N chips in which no defect is generated during various steps after the chips are integrated on the wafer by executing the above steps. Then, the data ("0", "1", etc.) are written into the capacitors of the chips, and then the baking at 150° C. was applied to the wafer. Then, the data were read from the capacitors under the worst conditions (e.g., the lowest power supply voltage of 4.5 V, and the temperature of 85° C.) for the FeRAM operation guarantee, and then it was checked whether or not the read data are equal to the initially-written data. Further, the opposite data to the currently-read data were written into the capacitors (i.e., "0", "1" are reversed), and then it was checked whether or not the data can be read correctly. Then, if the error is detected in any one of above two readings in this flow, it was decided that the chip was "defective", and the number of the defective chips was designated as m.

An ordinate of FIG. 12 denotes a wafer retention yield (%) that is defined by (m/n)×100. The retention means the capability that can hold the data for a long time without the data destruction. An abscissa of FIG. 12 denotes a cumulative baking time (hour).

In this experiment, the thickness of the second capacitor protection insulating film 16 was set to 100 nm. For the purpose of comparison, there was also examined the case where the second capacitor protection insulating film 16 is not formed but the second interlayer insulating film 17 is formed, by the HDPCVD method, directly on the first capacitor protection insulating film 14 made of alumina.

As shown in FIG. 12, in the case where the second capacitor protection insulating film 16 is not formed, the yield starts to become worse immediately after the baking is applied.

In contrast, in the case where the second capacitor protection insulating film 16 is formed, the yield does not become worse after the baking is applied for 1000 hour, and keeps a value close to almost 100%.

According to this result, it can be understood that where the second interlayer insulating film 17 is formed by the HDPCVD method, the process damage to the capacitor Q cannot be sufficiently prevented only by the first capacitor protection insulating film 14, but the damage to the capacitor Q can be reduced effectively by further forming the second capacitor protection insulating film 16 on the first capacitor protection insulating film 14.

Second Embodiment

A second embodiment of the present invention will be explained with reference to the drawings hereinafter.

Figure 13A:
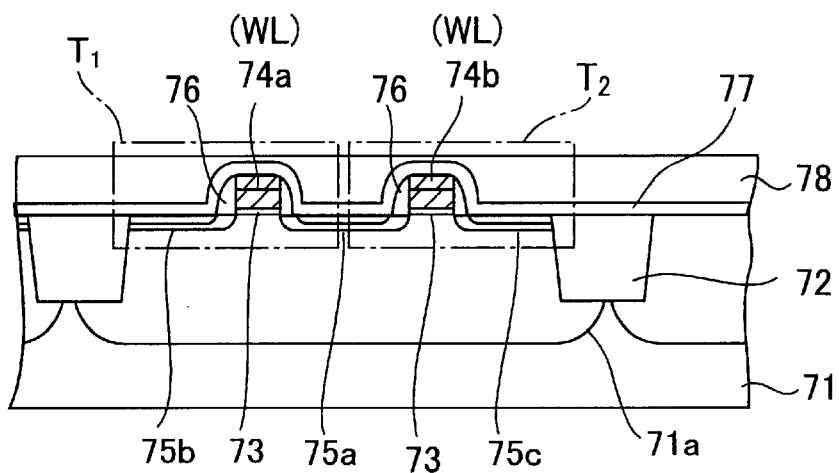
FIGS. 13A to 13N are sectional views showing steps of manufacturing an FeRAM as a semiconductor device according to a second embodiment of the present invention.
Figure 13B:
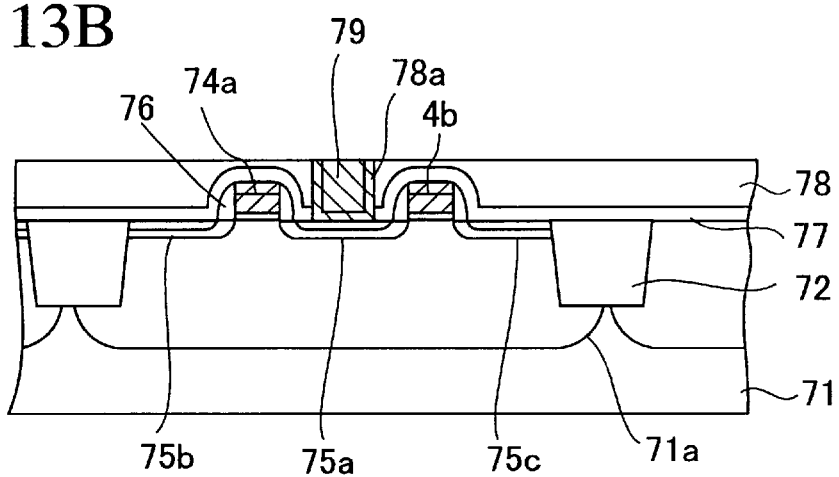
Figure 13C:
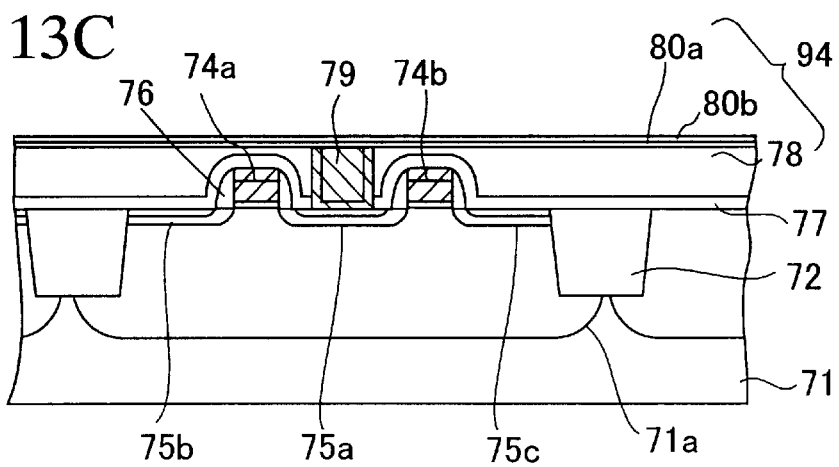
Figure 13D:
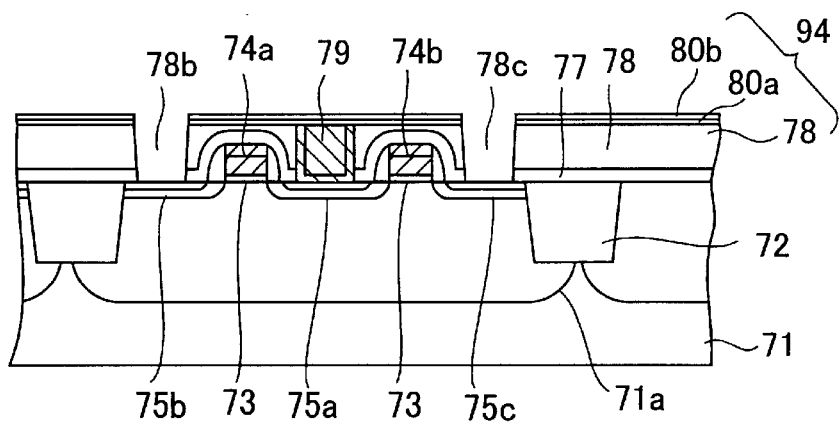
Figure 13E:
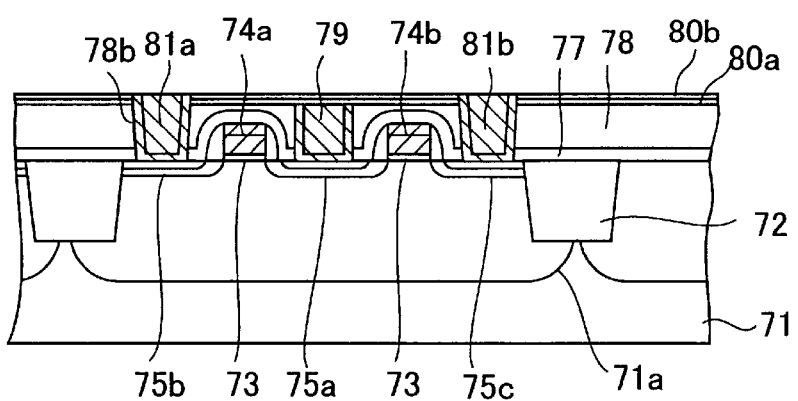
Figure 13F:
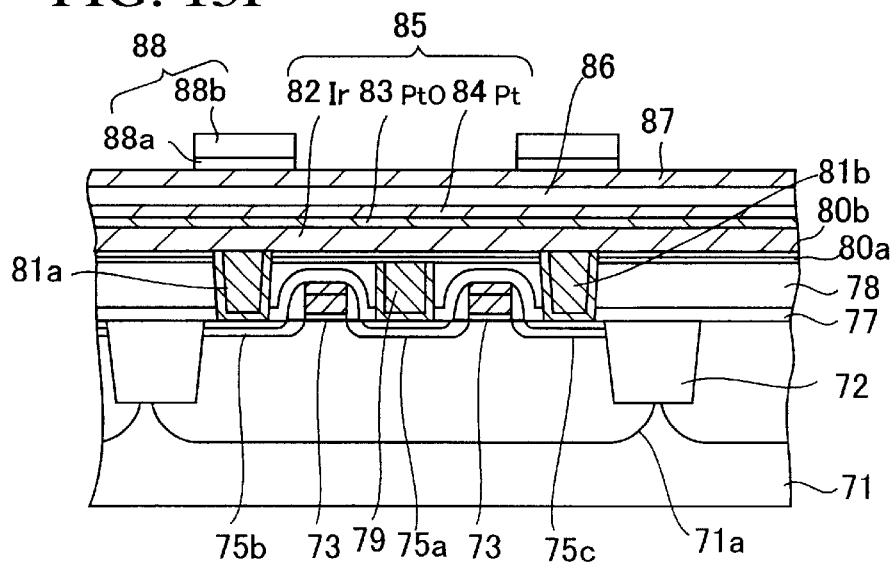
Figure 13G:
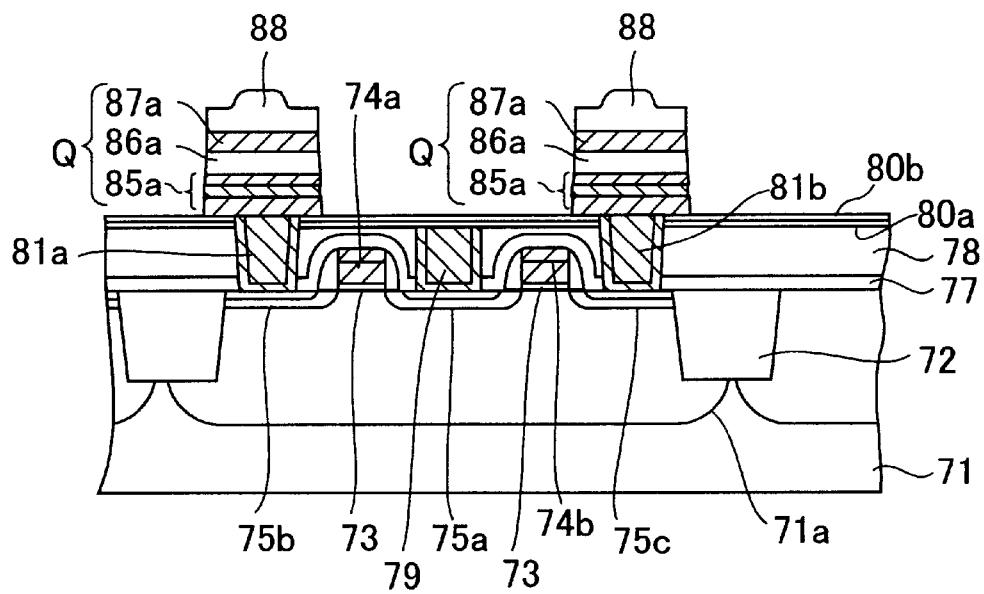
Figure 13H:
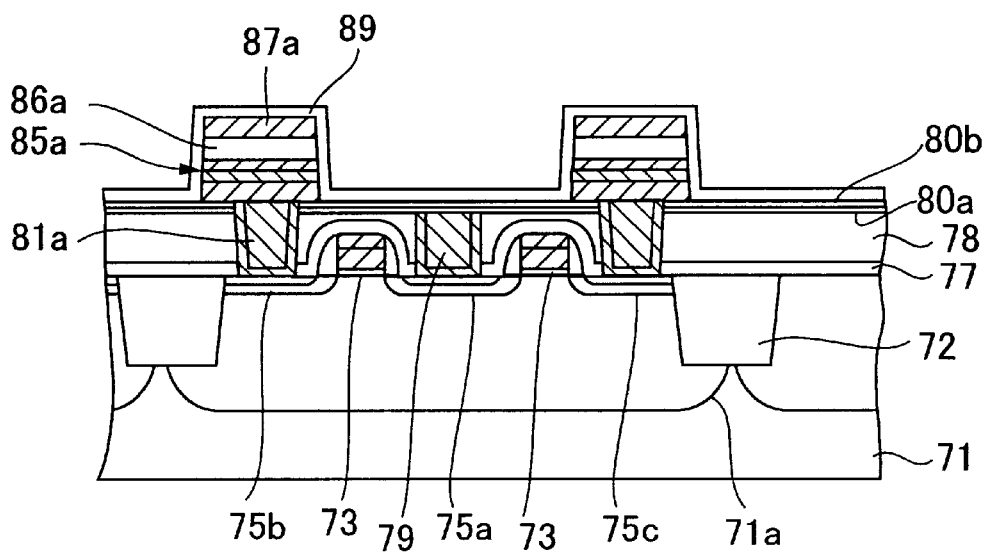
Figure 13I:
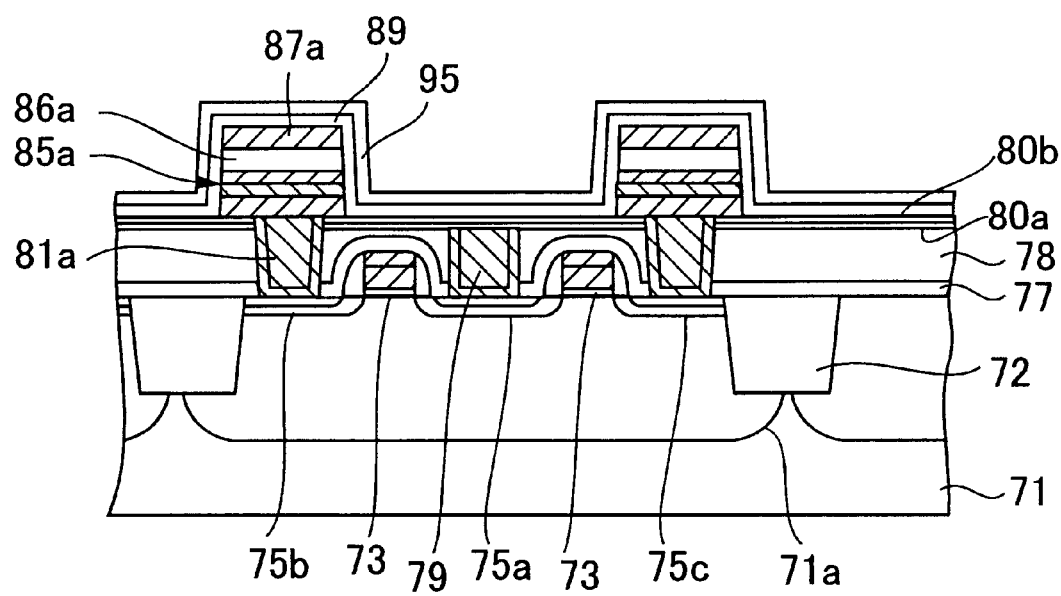
Figure 13J:
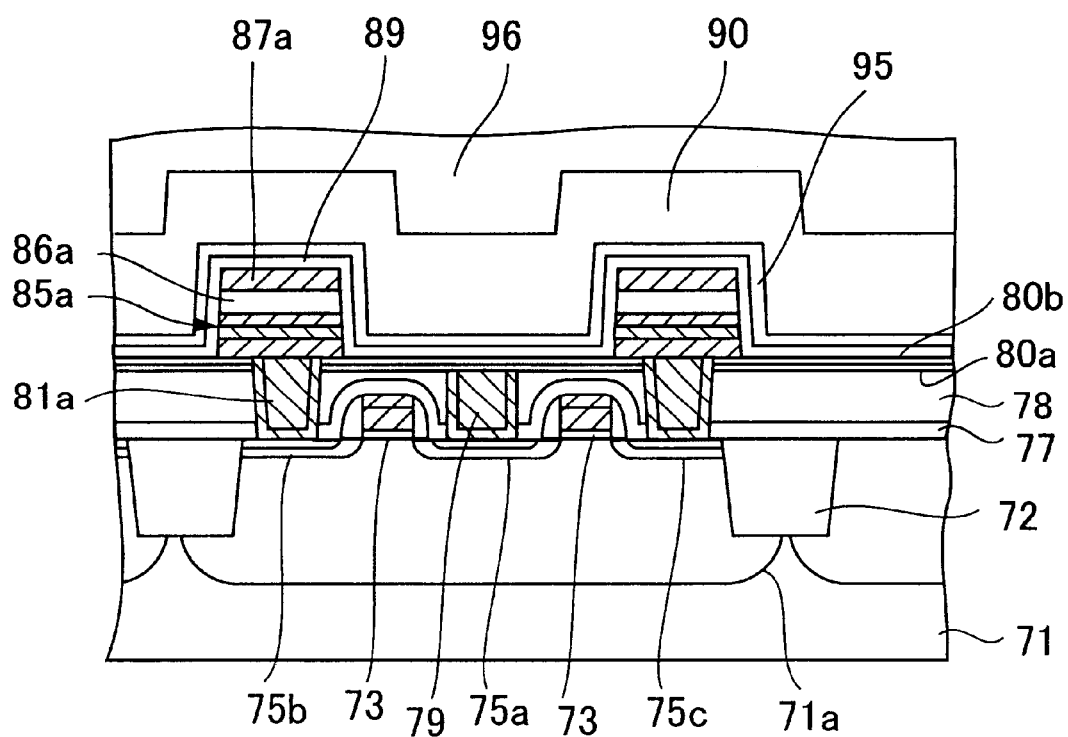
Figure 13K:
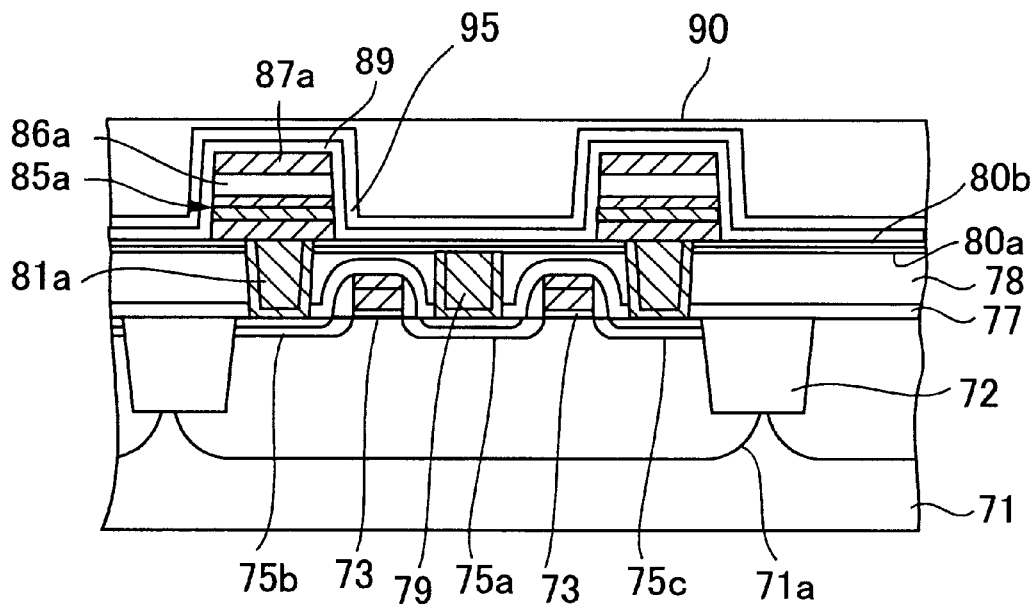
Figure 13L:
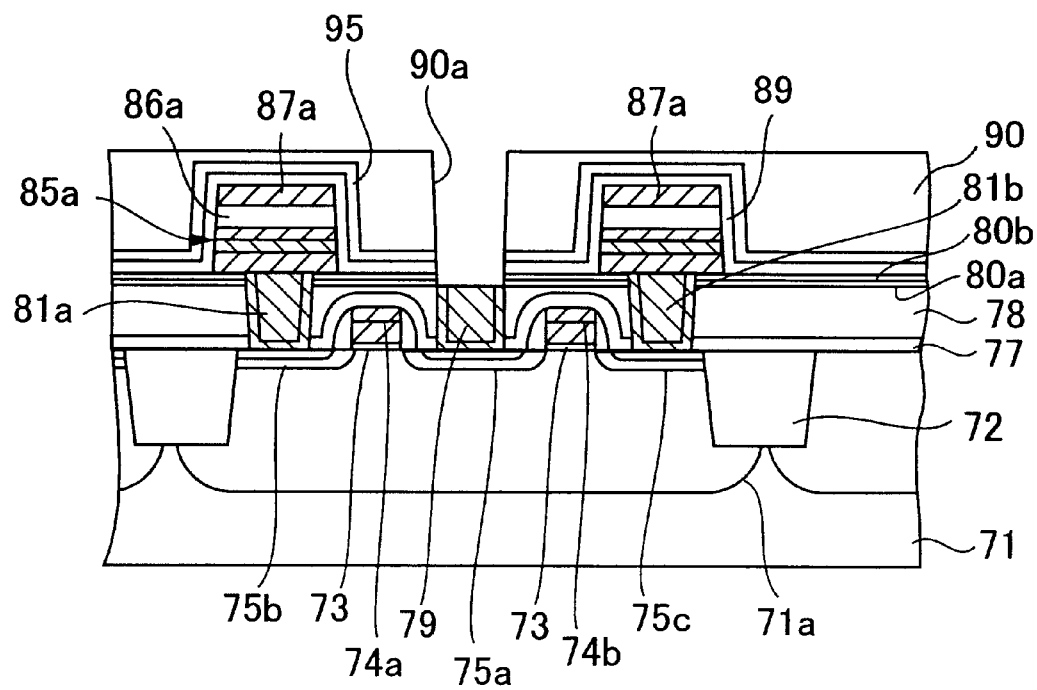
Figure 13M:
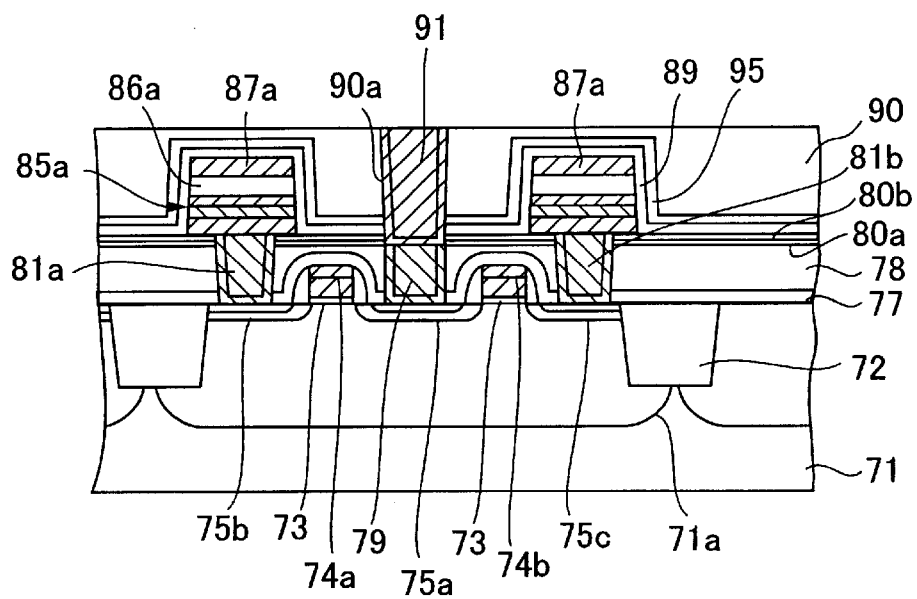
Figure 13N:
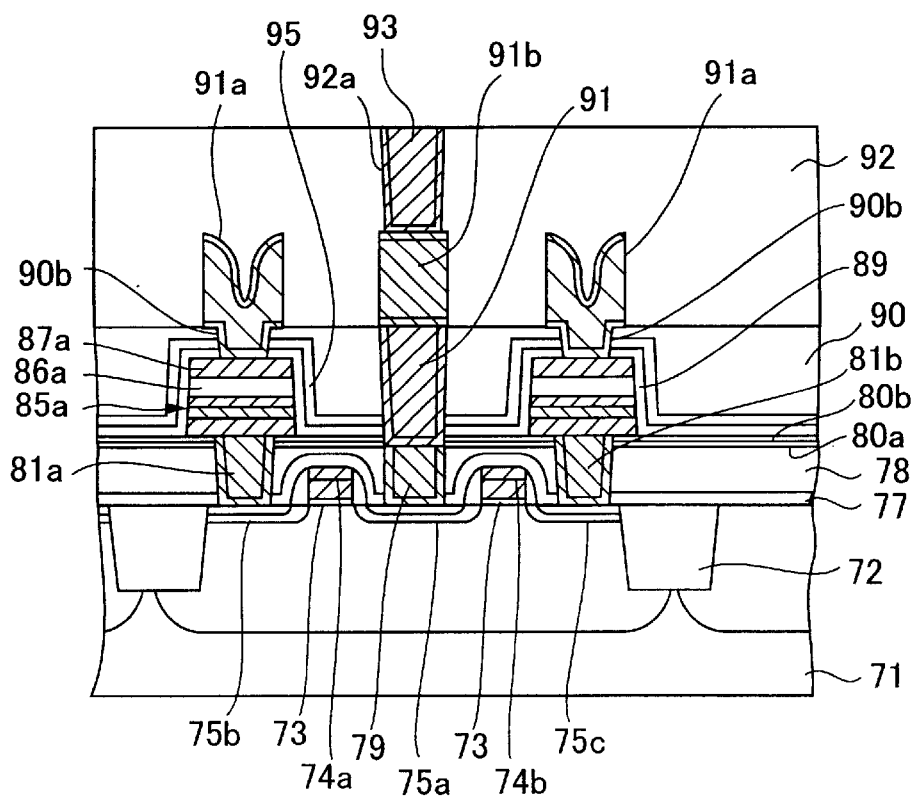

FIGS. 13A to 13N are sectional views showing steps of manufacturing a semiconductor device according to a second embodiment of the present invention.

In the second embodiment, the first embodiment is applied to a stacked FeRAM.

First, steps up to obtain a sectional structure shown in FIG. 13A will be explained hereunder.

As shown in FIG. 13A, an device isolating insulating film 72 having the STI structure is formed by forming an device isolation recess around a transistor forming region of an n-type or p-type silicon (semiconductor) substrate 71 by the photolithography method and then burying a silicon oxide ($SiO_2$) in the device isolation recess. It should be noted that an insulating film formed by the LOCOS method may be employed as the device isolating insulating film.

Then, a p-well 71a is formed by introducing the p-type impurity into the transistor forming region of the silicon substrate 71. Then, a silicon oxide film serving as a gate insulating film 73 is formed by thermally oxidizing a surface of the transistor forming region of the silicon substrate 71.

Then, an amorphous silicon film or a polysilicon film and a tungsten silicide film are formed sequentially on an overall upper surface of the silicon substrate 71. Then, gate electrodes 74a, 74b are formed by patterning the silicon film and the tungsten silicide film by virtue of the photolithography method.

It should be noted that two gate electrodes 74a, 74b are formed in parallel on one p-well 71a, and these gate electrodes 74a, 74b constitute a part of the word line WL.

Then, first to third n-type impurity diffusion regions 75a to 75c serving as the source/drain are formed by ion-implanting the n-type impurity into the p-well 71a on both sides of the gate electrodes 74a, 74b.

Then, an insulating film, e.g., a silicon oxide ($SiO_2$) film is formed on the overall surface of the silicon substrate 71 by the CVD method. Then, the insulating film is etched back to be left as a sidewall insulating film 76 on both side portions of the gate electrodes 74a, 74b.

Then, the n-type impurity is ion-implanted again into the first to third n-type impurity diffusion regions 75a to 75c by using the gate electrodes 74a, 74b and the sidewall insulating films 76 as a mask. Thus, the first to third n-type impurity diffusion regions 75a to 75c have the LDD structure.

In this case, the first n-type impurity diffusion region 75a formed between two gate electrodes 74a, 74b in one transistor forming region is electrically connected to a bit line, whereas the second and third n-type impurity diffusion regions 75b, 75c formed on both sides of the transistor forming region are electrically connected to the lower electrode of the capacitor respectively.

Up to the above steps, two MOS transistors $T_1$, $T_2$ having the gate electrodes 74a, 74b and the n-type impurity diffusion regions 75a to 75c of the LDD structure are formed in the p-well 71a.

Then, a silicon oxide nitride (SiON) film of about 200 nm thickness is formed as a cover insulating film 77, which covers the MOS transistors $T_1$, $T_2$, on the overall surface of the silicon substrate 71 by the plasma CVD method. Then, a silicon oxide ($SiO_2$) film of about 1.0 μm thickness is formed as a first interlayer insulating film 78 on the cover insulating film 77 by the plasma CVD method using the TEOS gas.

Then, as the densifying process of the first interlayer insulating film 78, the first interlayer insulating film 78 is annealed in the nitrogen atmosphere at the atmospheric pressure at the temperature of 700° C. for 30 minute, for example. Then, an upper surface of the first interlayer insulating film 78 is made flat by the CMP method.

Next, steps up to obtain a structure shown in FIG. 13B will be explained hereunder.

First, a first contact hole 78a having a depth to reach the first n-type impurity diffusion region 75a is formed by patterning the cover insulating film 77 and the first interlayer insulating film 78 by virtue of the photolithography method. Then, a titanium (Ti) film of 30 nm thickness and a titanium nitride (TiN) film of 50 nm thickness are formed sequentially as a glue film on an upper surface of the first interlayer insulating film 78 and an inner surface of the first contact hole 78a by the sputter method. Then, a tungsten (W) film is grown on the TiN film by the CVD method using $WF_6$ to bury perfectly the inside of the first contact hole 78a.

Then, the W film, the TiN film, and the Ti film are polished by the CMP method to remove from the upper surface of the first interlayer insulating film 78. The W film, the TiN film, and the Ti film left in the first contact hole 78a are used as a first plug 79.

Then, as shown in FIG. 13C, an oxidation prevention insulating film 80a, which is made of silicon nitride ($Si_3N_4$) having a thickness of 100 nm, and an underlying insulating film 80b, which is made of $SiO_2$ having a thickness of 100 nm, are formed sequentially on the first interlayer insulating film 78 and the first plug 79 by the plasma CVD method. This $SiO_2$ film is grown by the plasma CVD method using TEOS. The oxidation prevention insulating film 80a is formed for the purpose of not to generate the contact defect when the first plug 79 is abnormally oxidized in the heat treatment by the subsequent annealing, or the like. It is preferable that the film thickness of the oxidation prevention insulating film 80a be set to 70 nm or more, for example.

A first insulating film 94 is constructed by the first interlayer insulating film 78, the oxidation prevention insulating film 80a, and the underlying insulating film 80b.

Then, as shown in FIG. 13D, second and third contact holes 78b, 78c are formed on the second and third n-type impurity diffusion regions 75b, 75c by etching the first insulating film 94 while using the resist pattern (not shown).

Then, a Ti film of 30 nm thickness and a TiN film of 50 nm thickness are formed sequentially as a glue film on the underlying insulating film 80b and in the second and third contact holes 78b, 78c by the sputter method. Then, the W film is grown on the TiN film by the CVD method to bury perfectly the insides of the second and third contact holes 78b, 78c.

Then, as shown in FIG. 13E, the W film, the TiN film, and the Ti film are polished by the CMP method to remove from the upper surface of the underlying insulating film 80b. The W film, the TiN film, and the Ti film left in the second and third contact holes 78b, 78c are used as second and third plugs 81a, 81b respectively.

Next, steps up to form a structure shown in FIG. 13F will be explained hereunder.

First, an iridium (Ir) film 82 of 200 nm thickness, for example, is formed on the second and third plugs 81a, 81b and the underlying insulating film 80b by the sputter method. Then, an platinum oxide (PtO) film 83 of 23 nm thickness, for example, is formed on the iridium film 82 by the sputter method. Then, an platinum (Pt) film 84 of 50 nm thickness, for example, is formed on the platinum oxide film 83 by the sputter method.

The Ir film 82, the PtO film 83, and the Pt film 84 constitute a first conductive film 85 having a multi-layered structure. Note that either before or after the formation of the first conductive film 85, the underlying insulating film 80b may be annealed to prevent the peeling-off of the film, for example. RTA, which is conducted in argon atmosphere with a temperature at 600 to 750° C., for example, may be employed as the annealing method.

Then, a PZT film of 100 nm thickness, for example, is formed as a ferroelectric film 86 on the first conductive film 85 by the sputter method. As the method of forming the ferroelectric film 86, other than the above, there are the MOD method, the MOCVD (Metal Organic CVD) method, the sol-gel method, etc. Also, as the material of the ferroelectric film 86, other than the PZT, other PZT material such as PLCSZT, PLZT, or the like, the bismuth (Bi) material such as $SrBi_2(Ta_xNb_{1-x})_2O_9$ (where $0<x\leq 1$), $Bi_4Ti_2O_{12}$, or the like, etc.

Then, the ferroelectric film 86 is crystallized by executing the annealing in the oxygen atmosphere. As the annealing, the two-step RTA process having the first step and the second step, where the first step is performed in the gas mixture of argon and oxygen for 60 seconds with the substrate temperature at 600° C. and the second step is performed in the oxygen atmosphere for 60 seconds with the substrate temperature at 750° C., for example, is employed.

Then, an iridium oxide ($IrO_2$) film of 200 nm thickness, for example, is formed as a second conductive film 87 on the ferroelectric film 86 by the sputter method. As the growth conditions of the iridium oxide film, the sputter power is set to 1 kW, and the argon and the oxygen are supplied to the growth atmosphere.

Then, a TiN film 88a and an $SiO_2$ film 88b are formed sequentially as hard masks 88 on the second conductive film 87. The $SiO_2$ film 88b is formed by the plasma CVD method using the TEOS gas as the silicon source. The hard masks 88 are patterned into a capacitor planar shape over the second and third plugs 81a, 81b by the photolithography method.

Then, as shown in FIG. 13G, the second conductive film 87, the ferroelectric film 86, and the first conductive film 85, all being not covered with the hard masks 88, are patterned sequentially by the etching. In this case, the ferroelectric film 86 is etched by the sputter reaction in the atmosphere containing the chlorine and the argon. Also, the second conductive film 87 and the first conductive film 85 are etched by the sputter reaction in the bromine ($Br_2$) containing atmosphere.

Up to this step, a capacitor lower electrode 85a made of the first conductive film 85, a capacitor dielectric film 86a made of the ferroelectric film 86, and a capacitor upper electrode 87a made of the second conductive film 87 are formed on the oxidation prevention insulating film 80a. In one transistor forming region, one lower electrode 85a is electrically connected to the second n-type impurity diffusion region 75b via the second plug 81a, and the other lower electrode 85a is electrically connected to the third n-type impurity diffusion region 75c via the third plug 81b. Thereafter, the hard masks 88 are removed.

Then, in order to recover the damage of the ferroelectric film 86 caused by the etching, the recover annealing is carried out. The recover annealing in this case is carried out in the oxygen atmosphere at the substrate temperature of 650° C. for 60 minute, for example.

Then, as shown in FIG. 13H, an alumina ($Al_2O_3$) film of 50 nm thickness is formed as a first capacitor protection insulating film 89, which covers the capacitors Q, on the underlying insulating film 80b by the sputter. Then, the capacitors Q are annealed in the oxygen atmosphere at 650° C. for 60 minute. This first capacitor protection insulating film 89 protects the capacitors Q from the process damage.

Then, the silicon substrate 1 is put into the already-mentioned plasma CVD equipment (see FIG. 8), and then the film forming is carried out under following conditions.

TEOS gas flow rate . . . 460 sccm

He (carrier gas of TEOS) flow rate . . . 480 sccm $O_2$ flow rate . . . 700 sccm Pressure . . . 9.0 Torr Frequency of the high-frequency power supply 54 . . . 13.56 MHz Power of the high-frequency power supply 54 . . . 400 W Film forming temperature . . . 390° C.

According to this, as shown in FIG. 13I, a silicon oxide ($SiO_2$) film of 100 nm thickness is formed as a second capacitor protection insulating film 95 on the first capacitor protection insulating film 89.

It should be noted that the dehydrating process and the plasma process, if necessary, may be applied to the second capacitor protection insulating film 95. Since the conditions are similar to those in the first embodiment, their explanation will be omitted here.

Then, as shown in FIG. 13J, a silicon oxide ($SiO_2$) film of about 800 nm thickness is formed as a second interlayer insulating film (second insulating film) 90 on the second capacitor protection insulating film 95 by the already-mentioned HDPCVD method. The second interlayer insulating film 90 is formed in the HDPCVD equipment explained in the first embodiment and shown in FIG. 9. The film formation conditions are given as follows.

$SiH_4$ flow rate . . . 69 sccm $O_2$ flow rate . . . 300 sccm

Ar flow rate . . . 300 sccm

Pressure . . . 6.2 mTorr

Frequency of the first high-frequency power supply 64 . . . 13.56 MHz

Power of the first high-frequency power supply 64 . . . 3000 W

Frequency of the second high-frequency power supply 62 . . . 2 MHz

Power of the second high-frequency power supply 62 . . . 1200 W

Film forming temperature . . . 250° C.

Since the second capacitor protection insulating film 95 is formed under the second interlayer insulating film 90, the collision energy of the hydrogen ion H$^+$ and the sputter ion, generated during the film formation of the second interlayer insulating film 90, can be absorbed in the second capacitor protection film 95. Accordingly, the above ions can be blocked by the underlying first capacitor protection insulating film 89. Therefore, the deterioration of the capacitor dielectric film 86a by the above ions can be prevented.

In addition, the second capacitor protection insulating film 95 formed by using TEOS has the good coverage. Therefore, such second capacitor protection insulating film 95 can absorb the collided hydrogen ion H$^+$, uniformly both at the upper portion and at the side portion of the capacitor.

Further, since TEOS less generates the reducing hydrogen than SiH$_4$, there is no chance that the capacitor Q is deteriorated by the hydrogen.

It should be noted that the plasma process may be applied to the second interlayer insulating film 90, if necessary. The conditions are similar to those in the first embodiment and omitted here.

Then, a silicon oxide (SiO$_2$) film of about 700 nm thickness is formed as a third insulating film 96 on the second interlayer insulating film 90. Since the film forming conditions are similar to those in the first embodiment, their explanation will be omitted here.

Then, as shown in FIG. 13K, surfaces of the second interlayer insulating film 90 and the third insulating film 96 are planarized by polishing them by virtue of the CMP method. This planarization is carried out until the thickness of the second interlayer insulating film 90 on the upper electrode 87a becomes 300 nm.

At this time, since the third insulating film 96 is formed, the film thickness to be polished can be increased and thus the distribution of the film thickness after the polishing can be uniform.

Then, as shown in FIG. 13L, a hole 90a is formed on the first plug 79 by etching the second interlayer insulating film 90, the second capacitor protection insulating film 95, the first capacitor protection insulating film 89, the oxidation prevention insulating film 80a, and the underlying insulating film 80b while using the resist mask (not shown).

Then, a Ti film of 30 nm thickness and a TiN film of 50 nm thickness are formed sequentially as a glue film in the hole 90a and on the second interlayer insulating film 90. Then, a W film is grown on the glue film by the CVD method to bury the inside of the hole 90a completely.

Then, the W film, the TiN film, and the Ti film are polished by the CMP method to remove from the upper surface of the second interlayer insulating film 90. Then, as shown in FIG. 13M, the tungsten film and the glue film left in the hole 90a are used as a fourth plug 91. This fourth plug 91 is electrically connected to the first n-type impurity diffusion region 75a via the first plug 79.

Next, steps up to form a structure shown in FIG. 13N will be explained hereunder.

First, an SiON film is formed as a second oxidation preventing insulating film (not shown) on the fourth plug 91 and the second interlayer insulating film 90 by the CVD method. Then, contact holes 90b reaching the upper electrode 87a of the capacitor Q are formed by patterning the second oxidation preventing insulating film, the second interlayer insulating film 90, the second capacitor protection insulating film 95, and the first capacitor protection insulating film 89 by means of the photolithography method.

The capacitor Q that is subjected to the damage by the formation of the contact holes 90b can be restored by the annealing. This annealing is executed in the oxygen atmosphere at the substrate temperature of 550° C. for 60 minute, for example.

Then, the oxidation preventing insulating film formed on the second interlayer insulating film 90 is removed by the etching-back to expose the surface of the fourth plug 91.

Then, a multi-layered metal film is formed in the contact holes 90b on the upper electrodes 87a of the capacitors Q and on the second interlayer insulating film 90. Then, first-layer metal wirings 91a, which are electrically connected to the upper electrode 87a via the contact hole 90b, and a conductive contact pad 91b, which is electrically connected to the fourth plug 91, are formed by patterning the multi-layered metal film.

Then, a third interlayer insulating film 92 is formed on the second interlayer insulating film 90, the first-layer metal wirings 91a, and the conductive contact pad 91b. Thereafter, a hole 92a is formed on the conductive contact pad 91b by patterning the third interlayer insulating film 92. A fifth plug 93 consisting of the TiN film and the W film sequentially from the bottom is formed in the hole 92a.

Then, although not particularly shown, a second-layer wiring containing the bit line is formed on the third interlayer insulating film 92. The bit line is electrically connected to the first n-type impurity diffusion region 75a via the fifth plug 93, the conductive contact pad 91b, the fourth plug 91, and the first plug 79. Subsequently, the insulating film for covering the second-layer wiring layer, etc. are formed, but their details will be omitted here.

Figure 14:
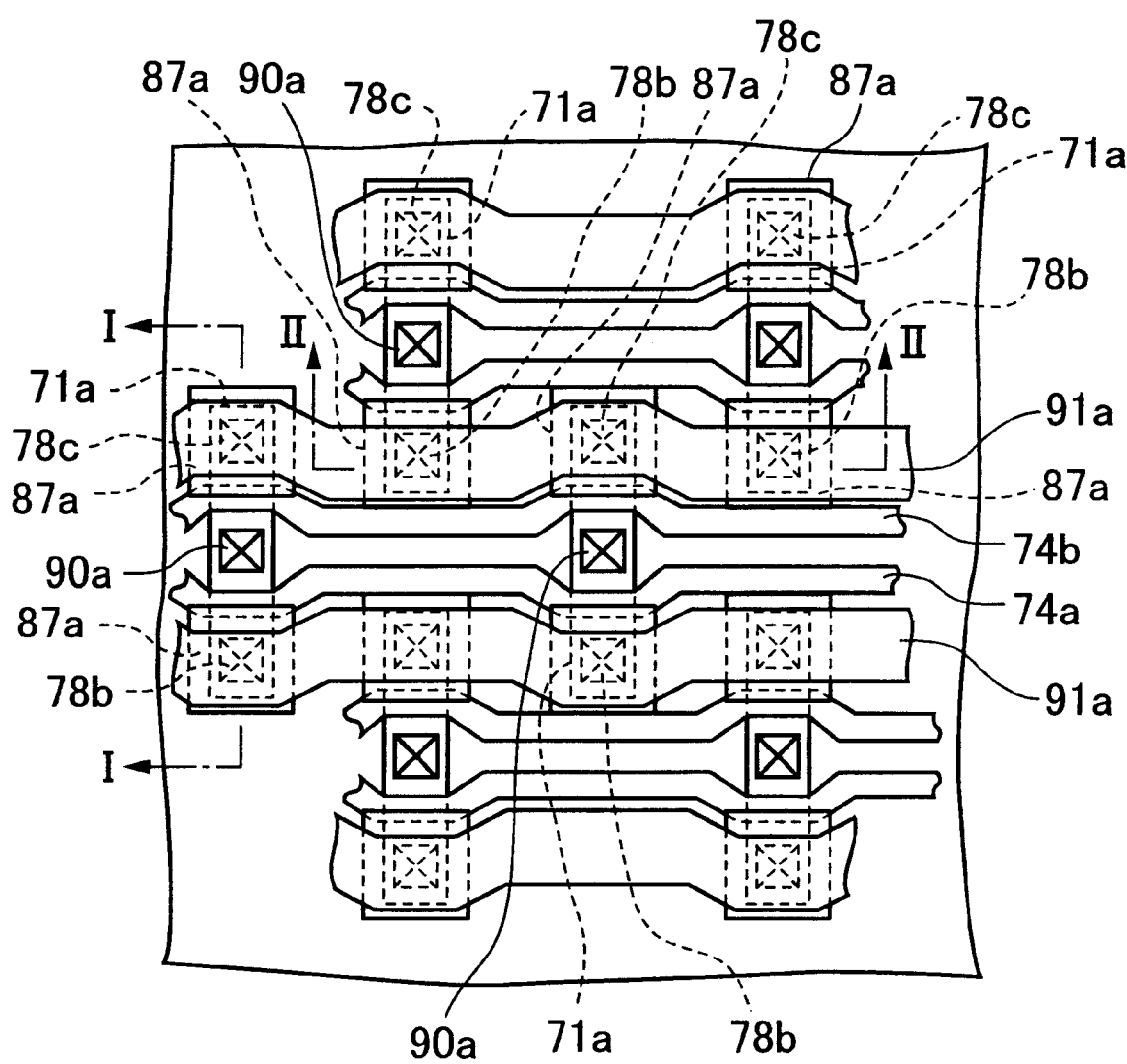
FIG. 14 is a plan view showing the semiconductor device, shown in FIG. 13N, according to the second embodiment of the present invention.
Figure 15:
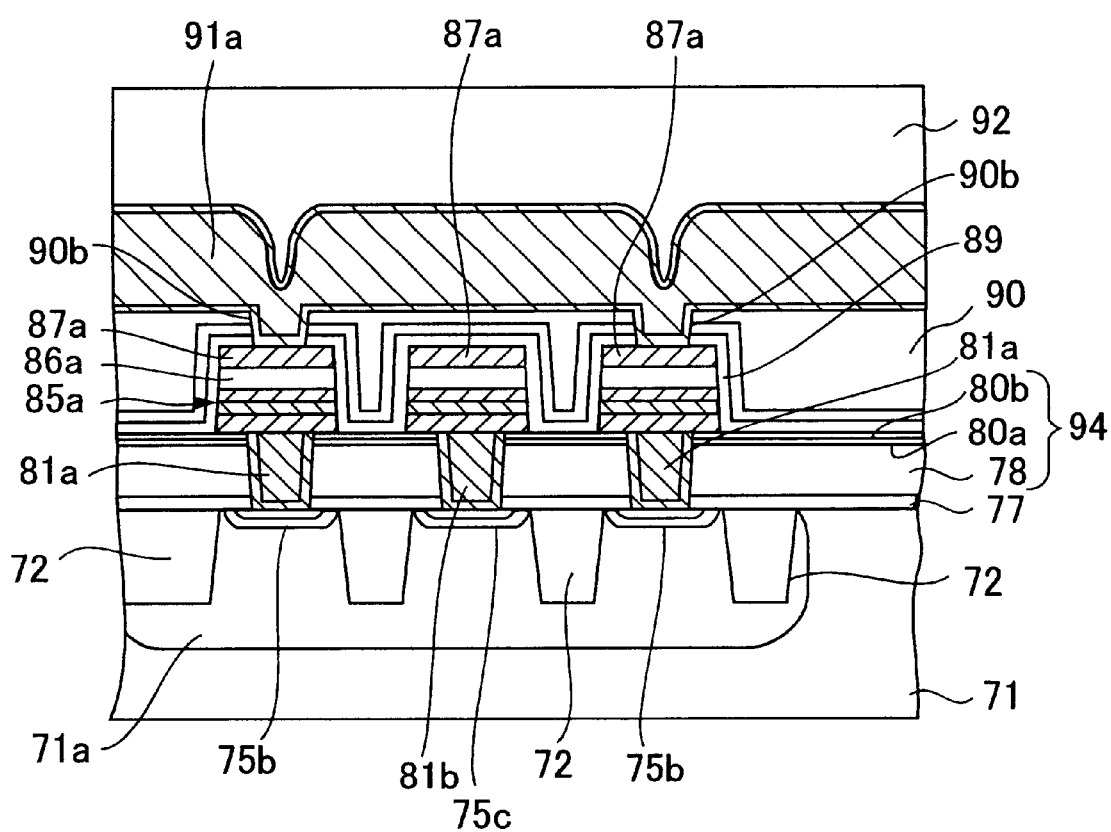
FIG. 15 is a sectional view showing the semiconductor device, taken along a II—II line in FIG. 14.

In this case, a plan view of this FIG. 13N is given as shown in FIG. 14, and FIG. 13N corresponds to a sectional view taken along a I—I line in FIG. 14. Also, FIG. 15 is a sectional view taken along a II—II line in FIG. 14.

As described above, in the present embodiment, since the second capacitor protection insulating film 95 is formed, it can be prevented that the capacitor dielectric film 86a is damaged during the formation of the second interlayer insulating film 90 by the HDPCVD methods.

According to the present invention, the first capacitor protection insulating film for covering the capacitor dielectric film and the upper electrode is formed. Then, the second capacitor protection insulating film is formed on the first capacitor protection insulating film in the state that the bias voltage is not applied to the semiconductor substrate, and then the second insulating film is formed in the state that the bias voltage is applied.

According to this, the second insulating film having the good filling property can be formed, and also the damage of the capacitor dielectric film, which is caused by the ions generated during the film formation of the second insulating film, can be reduced by the second capacitor protection insulating film.

Also, the first capacitor protection insulating film is formed in the state that the bias voltage is not applied to the semiconductor substrate. Therefore, the capacitor dielectric film can be prevented from deteriorating in the film formation.

In addition, since the second capacitor protection insulating film is formed by the chemical vapor deposition method using the reaction gas containing TEOS, the coverage of the second capacitor protection insulating film can be improved and also it is possible to make the upper portion and the side portion of the capacitor absorb the collision ions uniformly. Further, since the hydrogen, which is reducing substance, is generated more difficultly from TEOS rather than $SiH_4$, there is no possibility that the capacitor is deteriorated by the hydrogen.

Further, since the first capacitor protection insulating film is formed to have a double-layered structure consisting of the lower protection insulating film and the upper protection insulating film, it is difficult for the reducing substance such as the hydrogen to enter into the capacitor dielectric film.

Besides, where the capacitor is formed in plural, if the total film thickness of the first capacitor protection insulating film and the second capacitor protection insulating film is set smaller than half of the minimum interval among a plurality of upper electrodes, the spaces between the capacitors can be filled desirably with the second insulating film without formation of the cavity between the capacitors.

Moreover, the film thickness of the second insulating film is set thicker than the total film thickness of the capacitor upper electrode, the capacitor dielectric film, and the capacitor lower electrode, but thinner than the film thickness that is obtained by adding 1 µm to the total film thickness. Therefore, while suppressing the damage of the capacitor dielectric film maximally, the spaces between the capacitors can be filled with the second insulating film. Also, where the surface of the second insulating film is planarized by the polishing, the third insulating film is formed on the second insulating film prior to the polishing, and then the second and third insulating films are polished. Therefore, the film thickness to be polished can be increased and also the distribution of the film thickness after the polishing can be set uniformly.

What is claimed is:

1. A semiconductor device manufacturing method comprising the steps of:

forming a first insulating film over a semiconductor substrate;

forming a first conductive film, a ferroelectric film, and a second conductive film sequentially on the first insulating film;

forming an upper electrode of a capacitor by patterning the second conductive film;

forming a dielectric film of the capacitor by patterning the ferroelectric film;

forming a lower electrode of the capacitor by patterning the first conductive film;

forming a first capacitor protection insulating film covering the dielectric film and the upper electrode;

forming a second capacitor protection insulating film, which covers the first capacitor protection insulating film, by a chemical vapor deposition method in a state that a bias voltage is not applied to the semiconductor substrate; and forming a second insulating film on the second capacitor protection insulating film by the chemical vapor deposition method in a state that the bias voltage is applied to the semiconductor substrate.

2. A semiconductor device manufacturing method according to claim 1, wherein the step of forming the first capacitor protection insulating film is carried out in the state that a bias voltage is not applied to the semiconductor substrate.

3. A semiconductor device manufacturing method according to claim 1, wherein the step of forming the second capacitor protection insulating film is carried out at a higher pressure than the step of forming the second insulating film.

4. A semiconductor device manufacturing method according to claim 1, wherein a plasma density in the step of forming the second capacitor protection insulating film is lower than the plasma density in the step of forming the second insulating film.

5. A semiconductor device manufacturing method according to claim 1, wherein the step of forming the second capacitor protection insulating film is carried out by a chemical vapor deposition method using a reaction gas containing TEOS.

6. A semiconductor device manufacturing method according to claim 1, wherein the step of forming the second insulating film is carried out by a chemical vapor deposition method using a reaction gas containing any one of $SiH_4$, $Si_2H_6$, $Si_3H_8$, and $SiCl_4$.

7. A semiconductor device manufacturing method according to claim 6, wherein, in the step of forming the second insulating film, a gas containing any one of fluorine, phosphorus, and boron is added to the reaction gas.

8. A semiconductor device manufacturing method according to claim 1, wherein the step of forming the second capacitor protection insulating film includes the step of executing a hydrating process by heating the second capacitor protection insulating film.

9. A semiconductor device manufacturing method according to claim 1, wherein the step of forming the second capacitor protection insulating film includes the step of improving a film quality by exposing the second capacitor protection insulating film to a plasma atmosphere containing N (nitrogen).

10. A semiconductor device manufacturing method according to claim 1, wherein the step of forming the second insulating film includes the step of improving a film quality by exposing the second insulating film to a plasma atmosphere containing N (nitrogen).

11. A semiconductor device manufacturing method according to claim 1, wherein the step of forming the first capacitor protection insulating film includes the steps of, forming a lower protection insulating film, which covers the dielectric film and the upper electrode, on the first conductive film, patterning the lower protection insulating film to leave on at least the dielectric film and the upper electrode, and forming an upper protection insulating film on the first insulating film and the lower protection insulating film, whereby the upper protection insulating film and the lower protection insulating film are applied as the first capacitor protection insulating film.

12. A semiconductor device manufacturing method according to claim 1, wherein the capacitor is formed in plural, and a total film thickness of the first capacitor protection insulating film and the second capacitor protection insulating film is set smaller than half of a minimum interval among plural upper electrodes.

13. A semiconductor device manufacturing method according to claim 1, wherein a film thickness of the second insulating film is set thicker than a total film thickness of the lower electrode, the dielectric film, and the upper electrode and is set thinner than a film thickness that is obtained by adding 1 µm to the total film thickness.

14. A semiconductor device manufacturing method according to claim 1, wherein the step of forming the second insulating film includes the steps of, forming a third insulating film on the second insulating film, and planarizing surfaces of the second insulating film and the third insulating film by polishing.

* * * * *